(12) United States Patent
Jones et al.

(10) Patent No.: US 6,446,355 B1
(45) Date of Patent: Sep. 10, 2002

(54) DISK DRYING APPARATUS AND METHOD

(75) Inventors: Oliver David Jones, Watsonville; Kenneth C. McMahon, Morgan Hill; Jonathan Borkowski, Sunnyvale; Scott Petersen, Scotts Valley; Donald Stephens; Yassin Mehmandoust, both of Santa Cruz; James M. Olivas, Scotts Valley, all of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/579,841

(22) Filed: May 26, 2000

Related U.S. Application Data

(60) Provisional application No. 60/136,635, filed on May 27, 1999.

(51) Int. Cl.$^7$ .................................................. F26B 3/34
(52) U.S. Cl. ............................. 34/245; 34/467; 34/472; 34/229; 34/219; 34/220; 34/448; 118/715; 118/724; 118/725
(58) Field of Search ...................... 34/467, 472, 245, 34/229, 219, 220, 448; 118/715, 724, 725

(56) References Cited

U.S. PATENT DOCUMENTS

| | | | |
|---|---|---|---|
| 4,573,851 A | 3/1986 | Butler | |
| 4,611,966 A | 9/1986 | Johnson | |
| 4,856,544 A | 8/1989 | McConnell | |
| 4,955,402 A | 9/1990 | Miranda | ..................... 134/107 |
| 5,331,987 A | * 7/1994 | Hayashi et al. | .......... 134/102.1 |
| 5,369,891 A | 12/1994 | Kamikawa | |
| 5,520,744 A | 5/1996 | Fujikawa et al. | ............. 134/11 |
| 5,671,764 A | 9/1997 | Murakami et al. | .......... 134/200 |
| 5,704,493 A | 1/1998 | Fujikawa et al. | |
| 5,727,578 A | 3/1998 | Matthews | |
| 5,807,439 A | 9/1998 | Akatsu et al. | ................. 134/32 |
| 5,884,640 A | 3/1999 | Fishkin et al. | ............. 134/95.2 |
| 5,913,981 A | 6/1999 | Florez | |
| 6,021,791 A | 2/2000 | Dryer et al. | ............. 134/100.1 |
| 6,045,624 A | 4/2000 | Kamikawa et al. | ........... 134/30 |
| 6,095,167 A | 8/2000 | Florez | ........................ 134/183 |
| 6,108,932 A | * 8/2000 | Chai | ........................... 34/245 |
| 6,158,141 A | 12/2000 | Asada et al. | ................... 34/74 |
| 6,216,709 B1 | 4/2001 | Fung et al. | ................ 134/25.4 |

FOREIGN PATENT DOCUMENTS

| | | | |
|---|---|---|---|
| EP | 0 328 746 | 8/1989 | |
| EP | 0855736 A2 | 7/1998 | ........... H01L/21/00 |

(List continued on next page.)

*Primary Examiner*—William C. Doerrler
*Assistant Examiner*—Mark S Shulman
(74) *Attorney, Agent, or Firm*—Martine & Penilla, LLP

(57) ABSTRACT

Liquid is removed from disks by apparatus and methods for drying a disk that has been wet in a liquid bath. The disk and the bath are separated at a controlled rate to form a monolayer of liquid on the disk as the disk is positioned in a gas-filled volume. The separation may be by moving the disk out of the liquid bath, and the controlled rate is generally not less than the maximum rate at which a meniscus will form between the liquid bath and the surface of the disk when the liquid bath and the disk are separated. The gas-filled volume is defined by a hot chamber that continuously transfers thermal energy to the disk in the gas-filled volume. Hot gas directed into the volume and across the disk and out of the volume continuously transfers thermal energy to the disk. The directing of the gas out of the volume is independent of the separation of the bath and the disk. The thermal energy transferred to the disk in the volume evaporates the monolayer from the disk without decreasing the rate of separation of the disk and the bath below the maximum rate of such separation at which a meniscus will form between the bath and the surface of the disk during such separation. In addition to such separation, and directing of the hot gas across the disk and out of the volume, the relative humidity in the volume is kept low to inhibit recondensation of the liquid on the disks.

38 Claims, 15 Drawing Sheets

FOREIGN PATENT DOCUMENTS

| | | |
|---|---|---|
| JP | 01022030 | 1/1989 |
| JP | 64-22030 | 1/1989 |
| JP | 06267923 | 9/1994 |
| JP | 6-267923 | 9/1994 |
| JP | 09115871 | 5/1997 |
| JP | 9-115871 | 5/1997 |
| JP | 09-240776 | 9/1997 |
| JP | 09240776 | 9/1997 |
| JP | 10303166 | 11/1998 |
| JP | 10-303166 | 11/1998 |
| JP | 11-40535 | 2/1999 |
| JP | 11040535 | 2/1999 |

\* cited by examiner

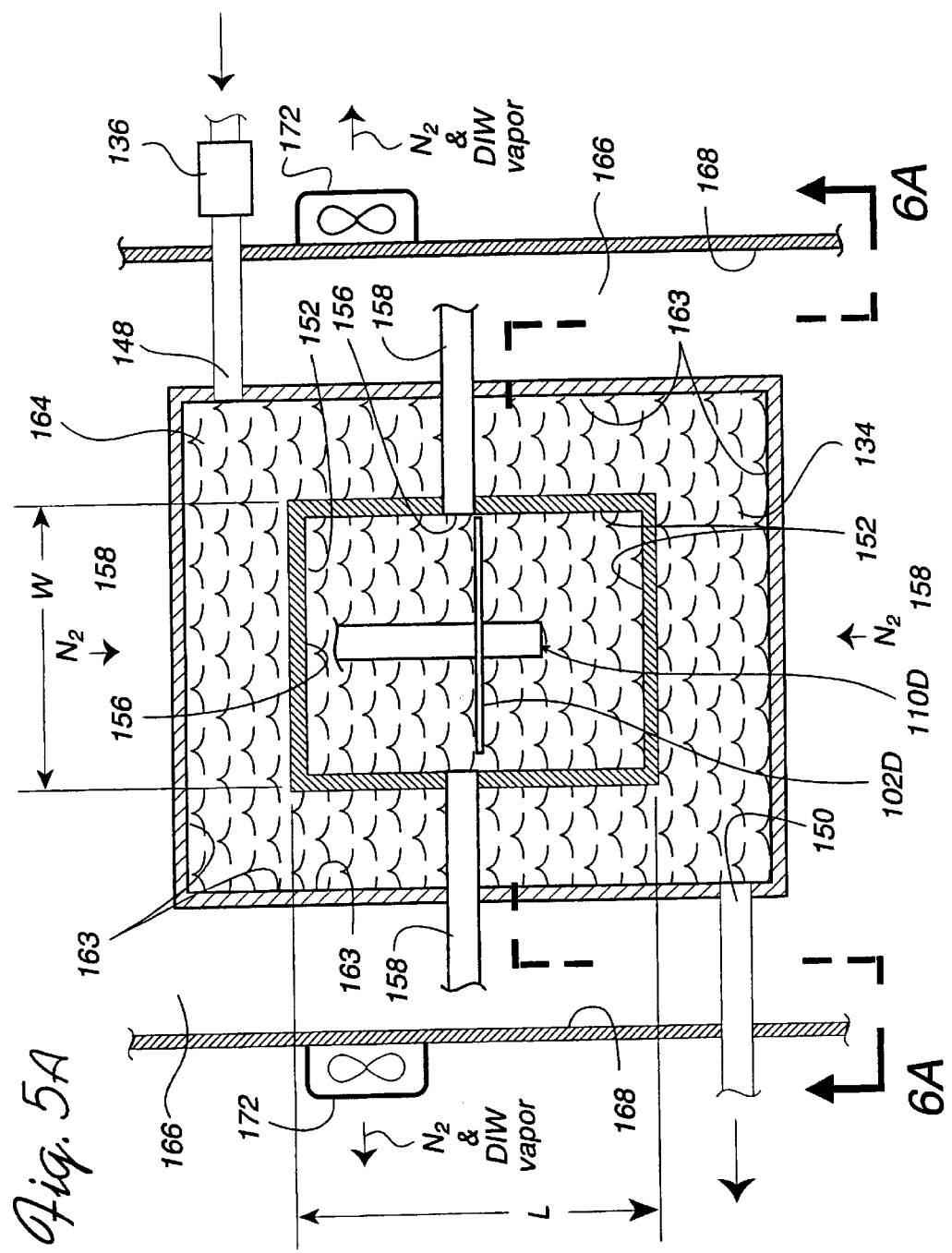

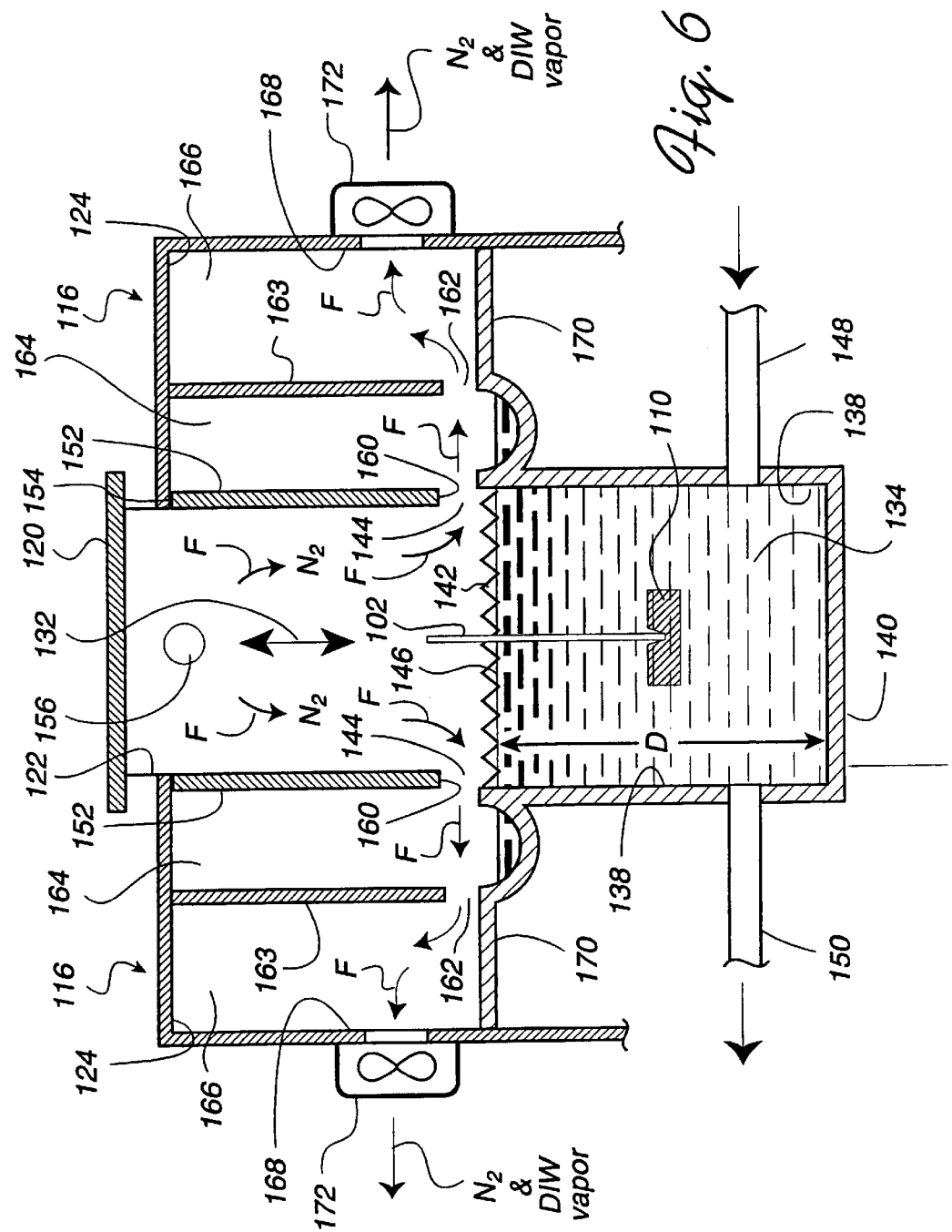

DISK DRYING APPARATUS AND METHOD

CROSS REFERENCE TO RELATED APPLICATION

This application claims priority from U.S. Provisional Patent Application No. 60/136,635 filed May 27, 1999, and entitled "Next Generation Modular Disk Cleaning System Including Transfer, Immersion, Cascade Brush Scrubber and Dryer Assemblies". This Provisional Application is herein incorporated by reference.

BACKGROUND OF THE INVENTION

1. Field of the Invention

The present invention relates generally to removing liquid from disks, and more particularly to apparatus and methods for drying a disk that has been wet in a liquid bath, after which the disk and the bath are separated at a controlled rate to form a thin layer of liquid on the disk as the disk is positioned in a gas-filled volume, wherein the volume is defined by a hot chamber that continuously transfers thermal energy to the disk in the volume, and wherein hot gas directed into the volume and across the disk and out of the volume continuously transfers thermal energy to the disk, so that the thermal energy transferred to the disk in the volume evaporates the thin layer from the disk without decreasing the rate of separation of the disk and the bath below a maximum rate of such separation at which a meniscus will form between the bath and the surface of the disk during such separation.

2. Description of the Related Art

In the manufacture of semiconductor devices, process chambers are interfaced to permit transfer of wafers between the interfaced chambers. Such wafer transfer is via transport modules that move the wafers, for example, through slots or ports that are provided in the adjacent walls of the interfaced chambers. For example, transport modules are generally used in conjunction with a variety of wafer processing modules, which may include semiconductor etching systems, material deposition systems, flat panel display etching systems, and wafer cleaning systems. Due to growing demands for cleanliness and high processing precision, there has been a greater need to reduce the amount of human interaction during, between, and after such processing steps. This need has been partially met with the implementation of vacuum transport modules which operate as an intermediate wafer handling apparatus (typically maintained at a reduced pressure, e.g., vacuum conditions). By way of example, a vacuum transport module may be physically located between one or more clean room storage facilities where wafers are stored, and multiple wafer processing modules where the wafers are actually processed, e.g., etched or have deposition performed thereon, or cleaned. In this manner, when a wafer is required for processing, a robot arm located within the transport module may be employed to retrieve a selected wafer from storage and place it into one of the multiple processing modules.

Despite use of such intermediate wafer handling apparatus, it is still necessary to clean and dry the wafers at the completion of such processing. As an example, after the wafers have been cleaned, the wafers may have a non-uniform coating of liquid. A wafer with such non-uniform coating of liquid, or with one or more drops of liquid thereon, or with any liquid thereon in any physical form, may be said to be "wet". In contrast, a wafer having a uniform coating of liquid may be said to be "uniformly wet".

In the past, items other than wafers have been processed. Items such as annular-shaped disks of many various sizes have been used for manufacturing data storage devices, for example. Such disks have also been subjected to a drying operation. After cleaning and while wet, such disks have been placed in a tank containing a bath of hot liquid. In one type of drying operation, the hot liquid has been drained from the tank at a rate such that a thin layer of liquid, rather than one or more drops of liquid, forms on that portion of such disk that is out of the draining liquid. The thin layer has been preferred over one or more drops because a drop of liquid has a high volume, e.g., from about 0.001 ml. to about 0.020 ml. In comparison to the drop, a thin layer of liquid on a substrate such as a 95 mm diameter disk, may only have a volume of at the maximum diameter of the disk of about 0.0007 ml, for example. Evaporation of a drop generally results in the concentration of small particles at the last small point on the disk at which the drop exists. Such concentration may result in defects in a data storage device made from the disk.

To remove the thin layer from such disk, reliance has been placed on the thermal energy stored in such disk to provide the thermal energy necessary to evaporate the thin layer. However, it appears that using only such stored thermal energy, the thin layer may evaporate from the disk at a rate less than the maximum rate of separation of the liquid bath and the disk at which a meniscus will form between the liquid bath and the surface of the disk during such separation. Thus, the rate at which the liquid is drained from the tank has to be decreased to match the rate of evaporation. Alternatively, the disk would have to be retained in the tank after the draining has been completed. Each of such decreased rate of draining and such retaining increases the time required to dry the disk, which increases the cost of fabricating devices based on the disk.

In view of the forgoing, what is needed is apparatus and methods of efficiently drying disks. Such efficient drying should allow the disks and the liquid to be separated at a rate no less than the maximum rate of separation of the liquid and the disk at which a meniscus will form between the liquid bath and the surface of the disk. Also, the efficient drying should rapidly remove from the disk a thin layer of liquid that forms on the disk as the disk and the bath are separated, wherein "rapidly" means such removal occurs before the disk and the bath have been completely separated e.g., separated by about 0.004 inches.

SUMMARY OF THE INVENTION

Broadly speaking, the present invention fills these needs by providing apparatus and methods of efficiently removing fluid from disks. The efficient removing is attained by providing apparatus and methods for drying a disk that has been uniformly wet in a fluid bath, in which the disk and the bath are separated at a controlled rate to form a thin layer of fluid on the disk as the disk is positioned in a gas-filled volume. In addition to such separation, the efficient removing is attained by defining the gas-filled volume by use of a hot chamber that continuously transfers thermal energy to the disk in the volume. Further, hot gas directed into the volume and across the disk and out of the volume continuously transfers thermal energy to the disk. The directing of the gas out of the volume is independent of the separation of the bath and the disk. The thermal energy transferred to the disk in the volume evaporates the thin layer from the disk without decreasing the rate of separation of the disk and the bath below the maximum rate of such separation at which a meniscus will form between the bath and the surface of the disk during such separation. In addition to such separation and directing of the hot gas across the disk and out of the volume, the relative humidity in the volume is kept low to inhibit recondensation of the fluid on the disks, for example.

Such efficient removal enables the disk throughput of such apparatus and method to be limited only by the type of disk that is being dried, and the type of fluid used to wet the disk. For example, the characteristics of particular types of disks and fluid dictate the maximum rate of such separation of the disk and the bath at which a meniscus will form between the bath and the surface of the disk during such separation and the disk will be uniformly wet.

In one embodiment of the present invention a disk drying system may include a bath enclosure configured to hold a fluid so that the fluid defines a top fluid surface. A temperature and humidity-controlled chamber may also be defined above the fluid surface. The chamber has a first opening at a first side proximate to the fluid surface and a second opening at a second side that is opposite to the first side.

In another embodiment of the present invention the disks to be dried have opposite sides, and apparatus for drying the disks may include a bath containing hot liquid, wherein the liquid defines an upper surface. Also provided is an enclosure having an inlet spaced from the upper surface and an outlet adjacent to the upper surface. The enclosure defines a continuous gas flow path from the inlet to the outlet, the flow path extending from the inlet along the upper surface and through the outlet. A heat transfer unit may supply hot gas to the inlet, with the hot gas being under pressure so as to flow in the continuous flow path. The heat transfer unit may transfer thermal energy to the enclosure so that the enclosure radiates thermal energy across the continuous flow path. A disk carrier may be movable in the bath and in the enclosure for moving the disk at a controlled rate out of the bath and into intersection with the continuous flow path. The rate may be controlled so that as the disk moves out of the bath a thin layer of the liquid is formed on each of the opposite sides of the disk. As the disk intersects the continuous flow path thermal energy from the hot gas and from the enclosure is received by the disk and by the thin layer. The received thermal energy evaporates the thin layer off the opposite sides of the disk.

In a related embodiment, the walls of the enclosure may define a perimeter of the enclosure. A plenum surrounds the perimeter of the enclosure for receiving the gas and the evaporated thin layer from the outlet. To assure that the flow path remains continuous and to control the relative humidity in the enclosure, a fan is provided for exhausting the gas, the evaporated thin layer, and vapor from the bath from the plenum. In a further embodiment, apparatus provided for drying a disk having opposite planar sides may include a bath for containing a fluid having an upper surface. A heat transfer chamber may have a plurality of walls, each of the walls having a bottom at generally the same level as the level of adjacent ones of the walls. The chamber defines a disk drying volume above the bottoms of the walls and within which a disk drying path extends. At least one of the walls is provided with a gas inlet positioned opposite to the bottom. A support may suspend the chamber above the bath with the disk drying path starting adjacent to the fluid surface and extending to a point adjacent to the gas inlet. The support positions the bottoms of the chamber walls spaced from the liquid surface to define an elongated outlet extending around the disk drying path. A hot gas supply may be connected to the gas inlet for flowing hot gas through the chamber across the opposite planar sides of the disk and out of the chamber through the elongated outlet to continuously transfer thermal energy at a selected temperature across the disk drying path, and thus to the disk and the thin film on the disk. A heater connected to the chamber between the gas inlet and the elongated outlet may radiate thermal energy across the disk drying path, and also to the disk and the thin film on the disk.

In a still other embodiment, a method for drying a disk may include an operation of introducing a disk being in a wet state into a fluid bath. The disk is removed from the fluid bath at a controlled rate along a selected path. Heated gas is applied to the disk as the disk is moved along the selected path and out of the fluid bath. Advantageously, the applied heated gas flows in at least one continuous flow path to the disk without recirculating the heated gas to the disk. In this manner, the applied heated gas transitions the disk to a dry state as the disk exits the fluid bath. A related feature is that thermal energy is radiated onto the disk as the disk moves along the selected path out of the fluid bath. In another related aspect of this method embodiment, an enclosure is provided to define the at least one continuous flow path. The applying of the heated gas may include flowing hot nitrogen in the at least one continuous flow path across the disk to effect the transition by evaporating the fluid from the disk into the hot nitrogen. The applying operation then removes the hot nitrogen and the evaporated fluid from the enclosure and away from the fluid bath. In this manner, the hot nitrogen and the evaporated fluid are not recirculated in the enclosure, such that the evaporated fluid does not accumulate, which accumulation would reduce the rate at which the evaporation takes place and foster recondensation of the fluid on the disks.

In yet another embodiment of the present invention a method for drying a disk may cause a disk to be immersed in a fluid bath to wet opposite sides of the disk with the fluid. Then the disk is moved out of the fluid bath into a defined volume along a selected path. The moving may be controlled to allow a meniscus on each of the opposite sides to form and leave a thin film of the fluid on the opposite sides of the disk as the disk moves from the fluid bath. By directing radiant energy into the thin film of the fluid on the opposite sides of the disk, and by flowing heated gas into the defined volume and along the disk as the disk is moved along the selected path out of the fluid bath, the thin film of the fluid is evaporated from the disk and combines with the heated gas flowing along the disk. An exit from the defined volume is provided for the combined removed thin film of the fluid and the gas. Advantageously, the combination of the radiant energy, the heated gas and the exit promote rapid evaporation of the thin film and foster a decrease in the time required to dry the disks.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, in which like reference numerals designate like structural elements.

FIG. 5A is a schematic plan view taken along line 5A—5A in FIG. 4D, showing a plenum into which the gas and the evaporated fluid flow from the outlet of the enclosure after drying a disk.

FIG. 6 is a schematic side elevational view of the apparatus viewed along line 6—6 in FIG. 5 showing the continuous flow of heated gas in the enclosure, wherein the continuous flow is onto the wafer and out of the enclosure.

DETAILED DESCRIPTION OF THE PREFERRED EMBODIMENTS

An invention is described for drying disks. The invention is described in terms of apparatus for and methods of efficiently removing liquid from disks. More particularly, the invention is described in respect to apparatus and methods for removing liquid from a disk to dry the disk after the disk has been wet in a liquid bath. The removing of the liquid is initiated as the disk and the bath are separated at a controlled rate to uniformly wet the disk, i.e. to form a thin layer of liquid on a portion of the disk that is out of the bath and in a hot-gas-filled volume defined by a hot chamber. The hot chamber and the hot gas continuously transfer thermal energy to the disk and the thin layer as the disk enters the volume. The removing of the liquid is completed as the disk enters the volume, in that the thermal energy transferred to the disk and to the thin layer rapidly evaporates the thin layer from the disk. The evaporation is at a high enough rate that there is no decrease in the rate of separation of the disk and the bath below the maximum rate of such separation at which a meniscus will form between the bath and the surface of the disk during such separation. By controlling the relative humidity in the hot chamber, recondensation of the evaporated thin layer and condensation of vapor from the bath onto the disk are inhibited. It will be obvious, however, to one skilled in the art, that the present invention may be practiced without some or all of these specific details. In other instances, well known process operations have not been described in detail in order not to obscure the present invention.

Figure 1:
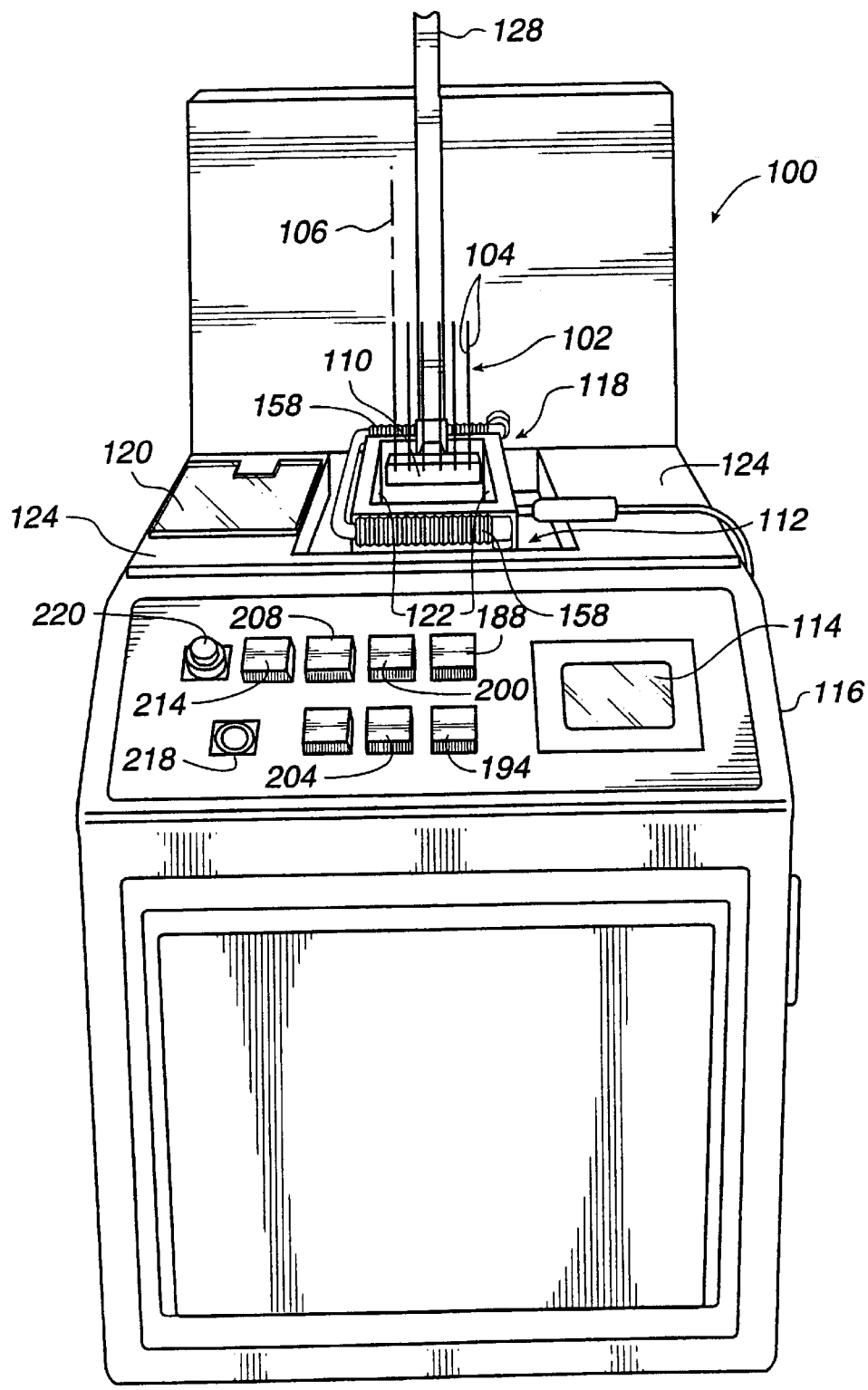
FIG. 1 depicts an apparatus for drying wafers according to the present invention, wherein a wafer carrier removes the wafers from a fluid-filled bath under the control of an operating panel.

FIG. 1 depicts an apparatus 100 for drying wafers 102 according to the present invention. The wafers 102 may be of various diameters, such as two hundred mm. or three hundred mm., for example. Each wafer 102 has opposed flat or planar sides 104 extending parallel to a wafer axis 106, and an edge 108 between the sides 104. To facilitate drying of the wafer 102, or drying many wafers 102, a wafer carrier 110 is provided for removing the one or more wafers 102 from a bath 112 under the control of an operating, or process control, panel 114 mounted on a housing 116.

Figure 1A:
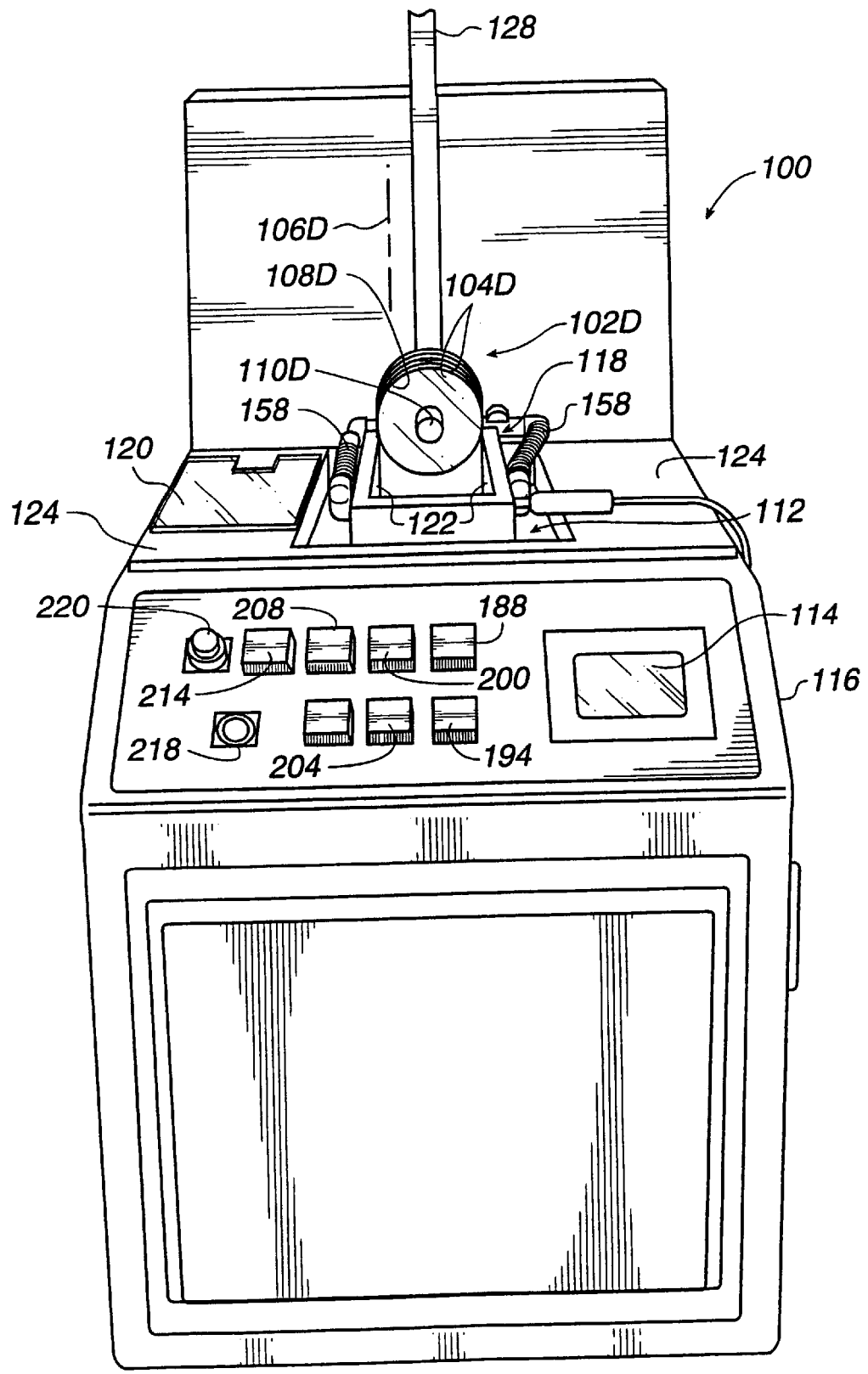
FIG. 1A depicts an apparatus for drying disks according to the present invention, wherein a disk carrier removes the disks from a fluid-filled bath under the control of an operating panel.

FIG. 1A depicts the apparatus 100 for drying disks 102D according to the present invention. The disks 102D may be of various diameters, such as ninety five mm., for example, may have a thickness of 0.8 mm, for example, and may be fabricated from aluminum or glass, for example. Each disk 102D has opposed flat or planar sides 104D extending parallel to a disk axis 106D, an edge 108D between the sides 104D, and a central aperture 109D. To facilitate drying of the disk 102D, or drying many disks 102D, the disk carrier 110D is provided for removing the one or more disks 102D from the bath 112 under the control of the operating panel 114 mounted on the housing 116.

Figure 2:
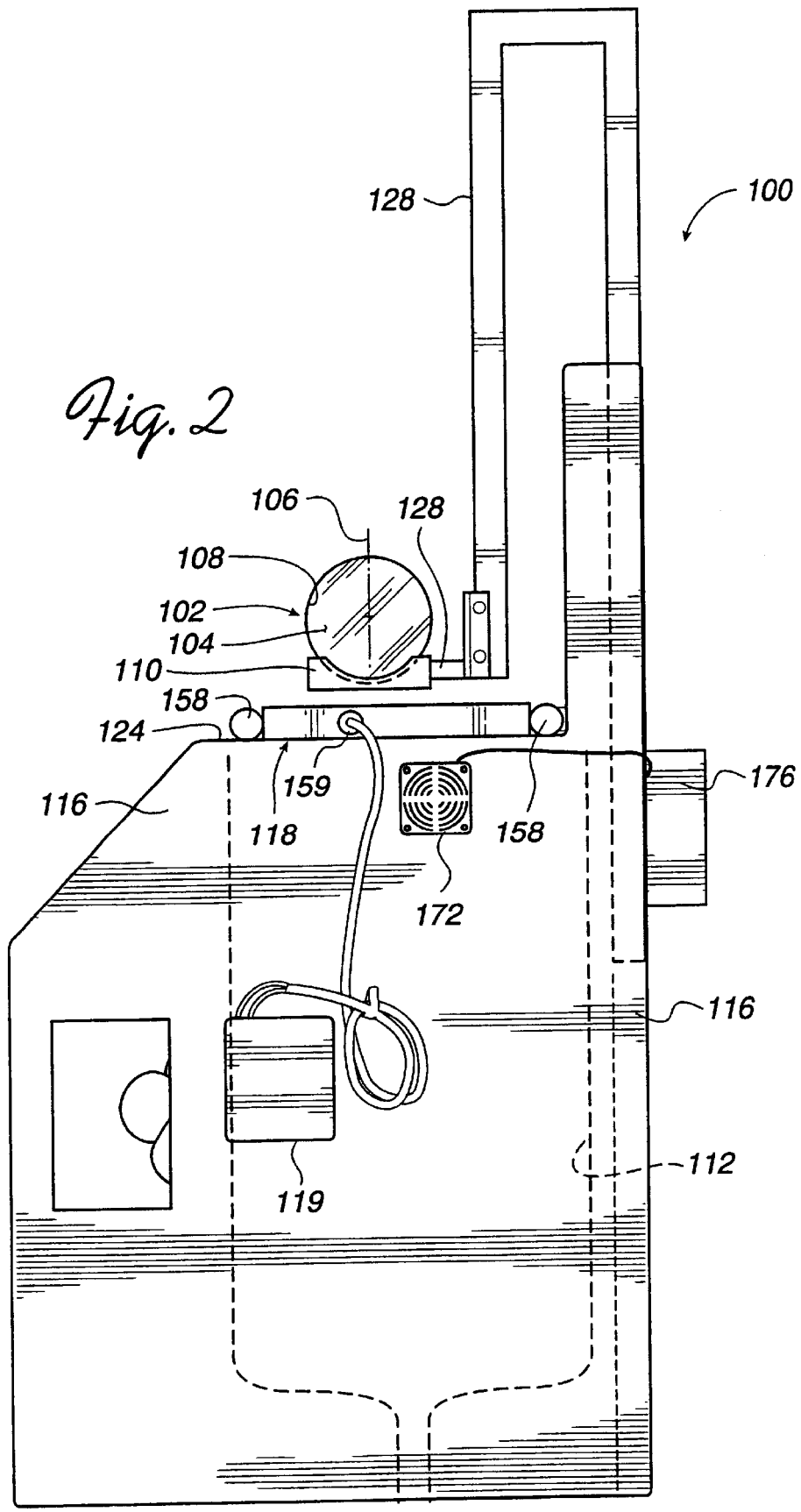
FIG. 2 is a side elevational view of the apparatus shown in FIG. 1, in which the carrier is shown removing a dry wafer from a drying enclosure mounted above the bath.
Figure 2A:
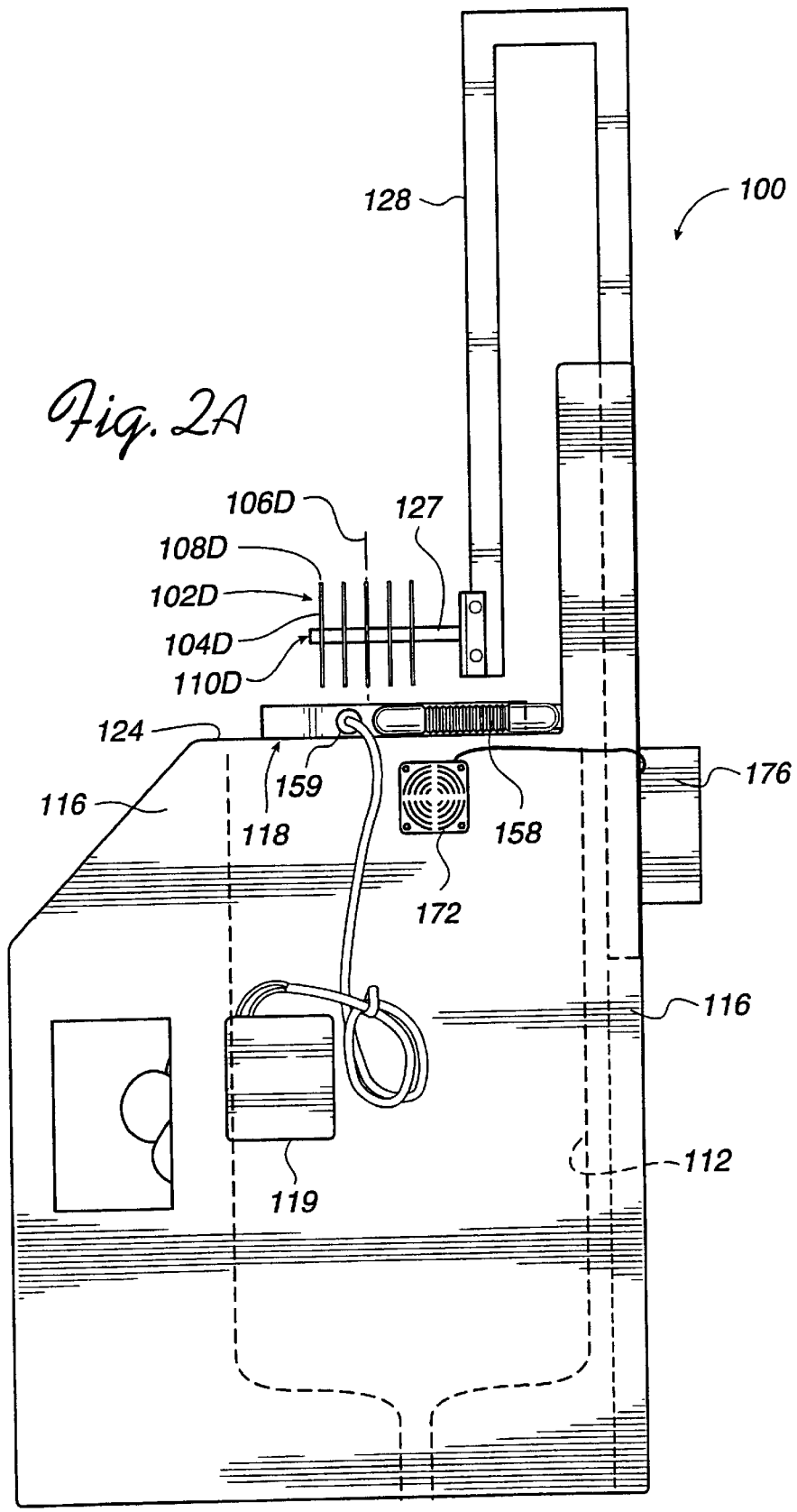
FIG. 2A is a side elevational view of the apparatus shown in FIG. 1, in which the carrier is shown removing a dry disk from a drying enclosure mounted above the bath.

FIG. 2 illustrates the apparatus 100 of FIG. 1, and depicts the carrier 110 removing a dry wafer 102 from a drying enclosure or chamber 118 mounted above the bath 112. An anti-static device 119 assures that no static charge exists in the enclosure 118 FIG. 2A correspondingly depicts the carrier 110 removing a dry disk 102D from the drying enclosure 118.

FIG. 3 shows the apparatus 100 of FIGS. 1 and 2 in plan view as including a hatch or cover 120 that closes the drying enclosure 118 during a wafer drying operation. FIG. 3A shows the corresponding apparatus 100 of FIGS. 1 and 2 in plan view as including the hatch 120 that closes the drying enclosure 118 during a disk drying operation. An opening 122 in a top panel 124 of the enclosure 118 is closed by the hatch 120, which is removable to allow access to the interior of the enclosure 118.

Figure 3A:
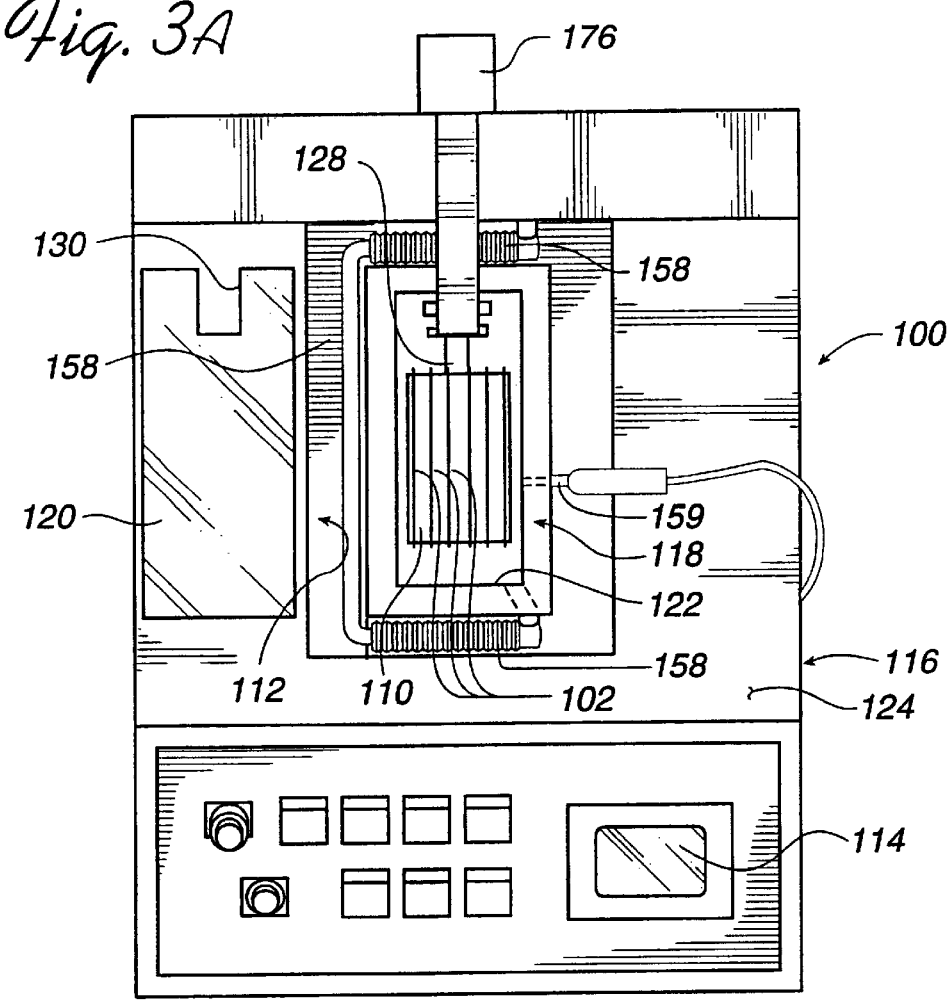
FIG. 3A is a plan view of the apparatus shown in FIGS. 1 and 2 showing a hatch above the bath for covering the wafer drying enclosure during a wafer drying operation.
Figure 3B:
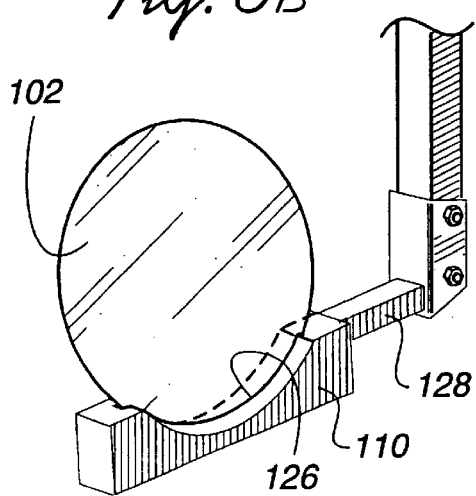
FIG. 3B is a view of a carrier for moving one wafer.
Figure 3C:
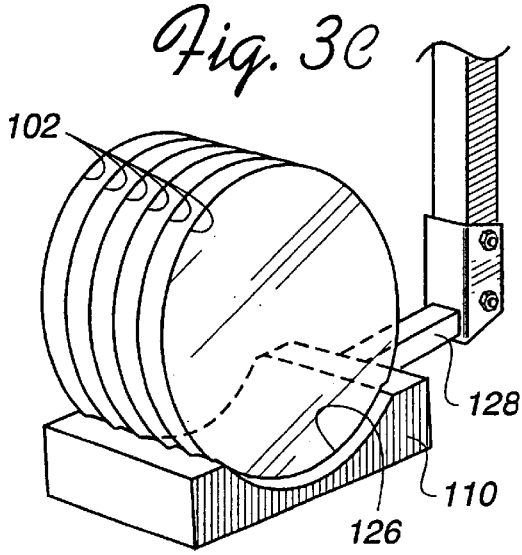
FIG. 3C is a view of a carrier for moving many wafers.
Figure 3D:
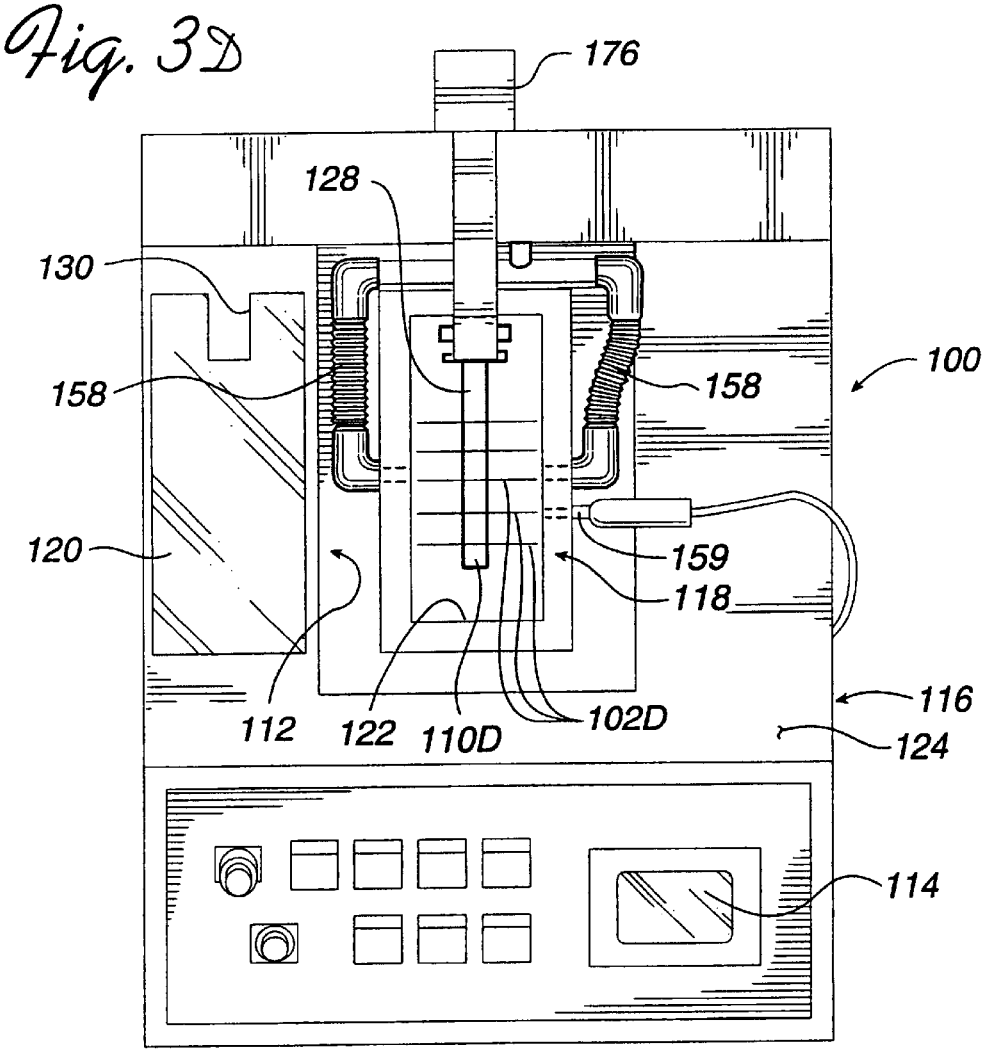
FIG. 3D is a plan view of the apparatus shown in FIGS. 1 and 2 showing a hatch above the bath for covering the disk drying enclosure during a disk drying operation.
Figure 3E:
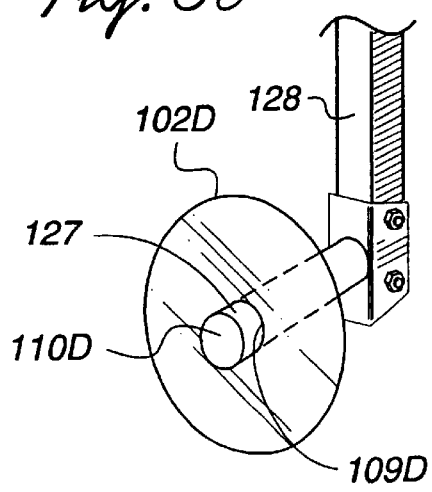
FIG. 3E is a view of a carrier for moving one disk.
Figure 3F:
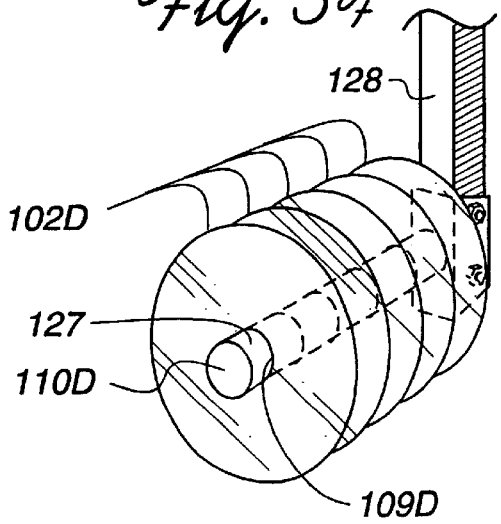
FIG. 3F is a view of a carrier for moving many disks.

FIGS. 3B and 3C show that the carrier 110 is provided with one or more grooves 126 to hold the wafers 102 in position for a drying operation. Each groove 126 holds one wafer 102 on the edge 108, i.e., in a vertical position with each opposite side 104 and the wafer axis 106 extending vertically. When the hatch 120 covers the opening, an arm 128 secured to the carrier 110 extends through a port 130 in the hatch 120 to facilitate moving the carrier 110, and a wafer or wafers 102 carried in the carrier 110, within the bath 112 and the gas-filled enclosure 118 along a wafer drying path 132. FIGS. 3E and 3F show the carrier 110 with the grooves 126 replaced by a rod 127D received in the aperture 109D to hold the disks 102D. FIGS. 1A, 2A, and 3D through 3F also show an alternate orientation of the disks 102D as held by the rod 127, which orientation is rotated ninety degrees from the orientation of the wafers 102 in the grooves 126 as shown in FIGS. 1, 2, and 3A through 3C.

Figure 4A:
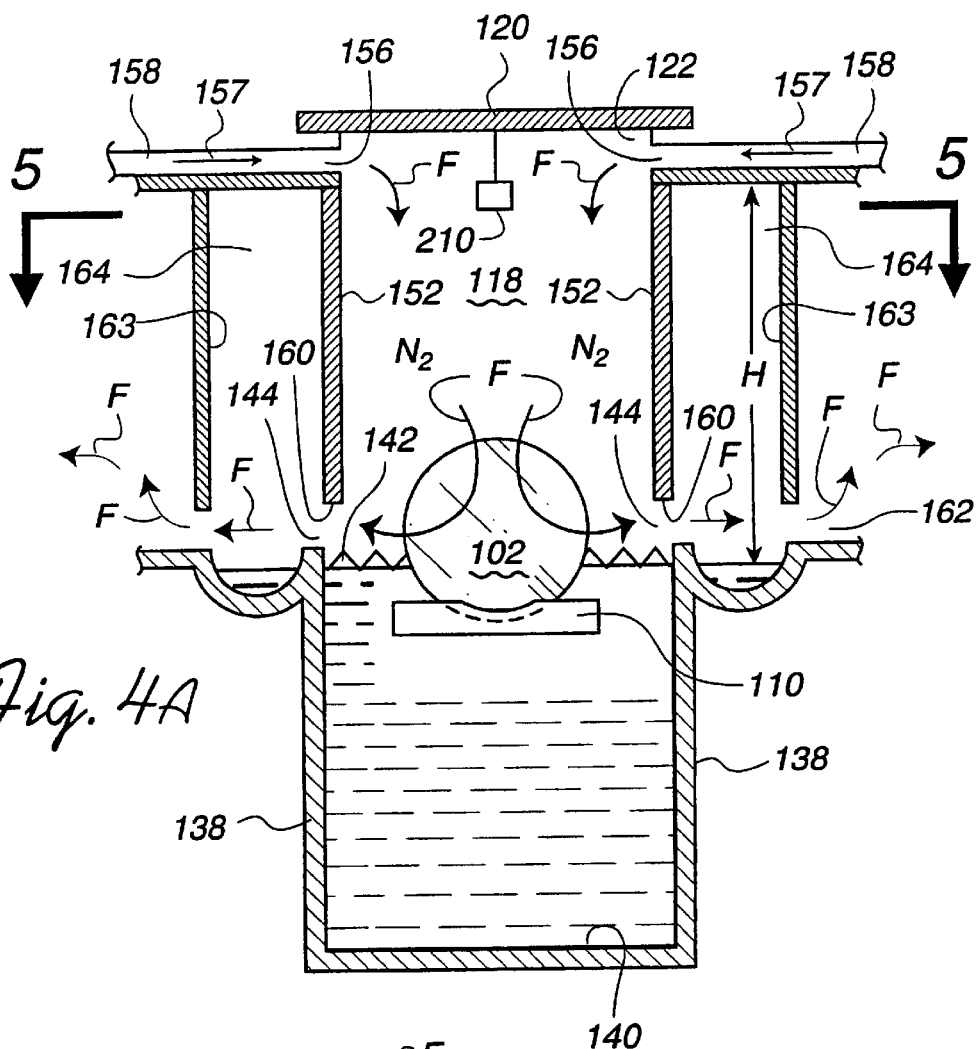
FIG. 4A is a schematic side elevational view of the apparatus for drying wafers showing the bath containing a fluid having an upper surface that is below opposite walls of the enclosure, wherein the walls are provided with gas inlets and with an outlet for the gas and fluid evaporated from the wafer.
Figure 4C:
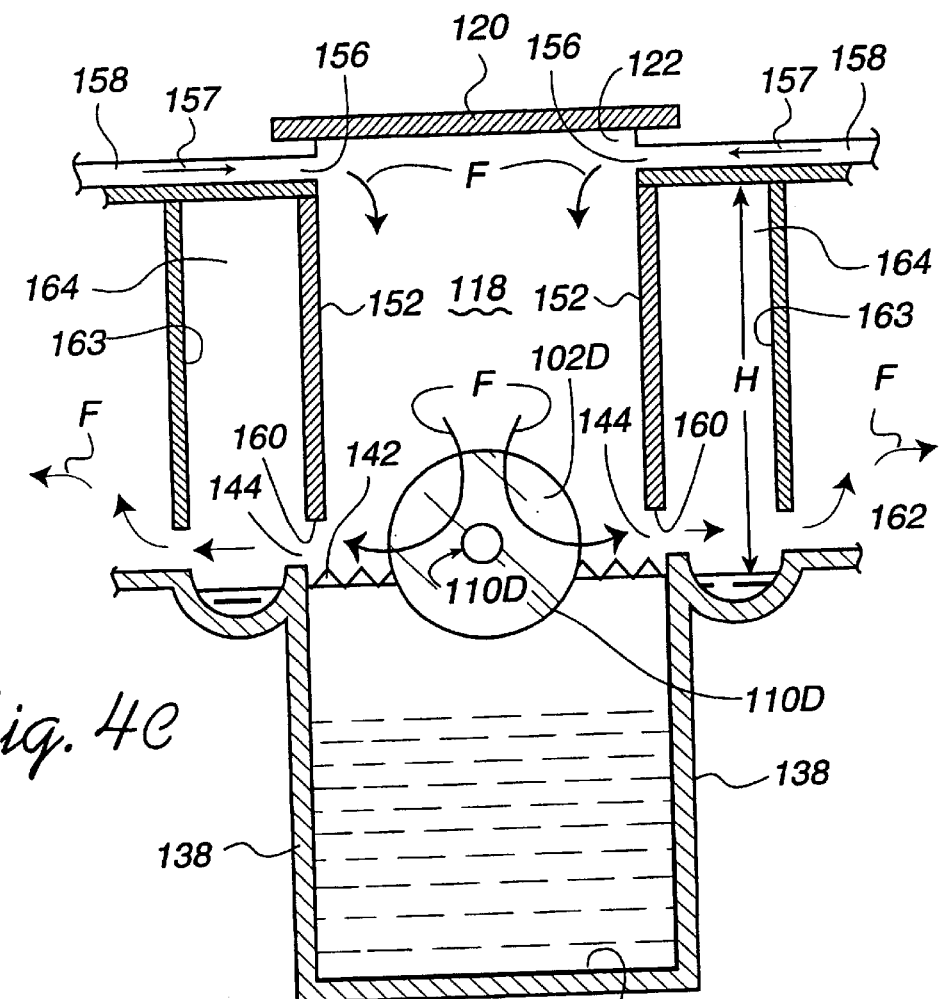
FIG. 4C is a schematic side elevational view of the apparatus for drying disks showing the bath containing the fluid, wherein the walls are provided with gas inlets and with an outlet for the gas and fluid evaporated from the disk.
Figure 5:
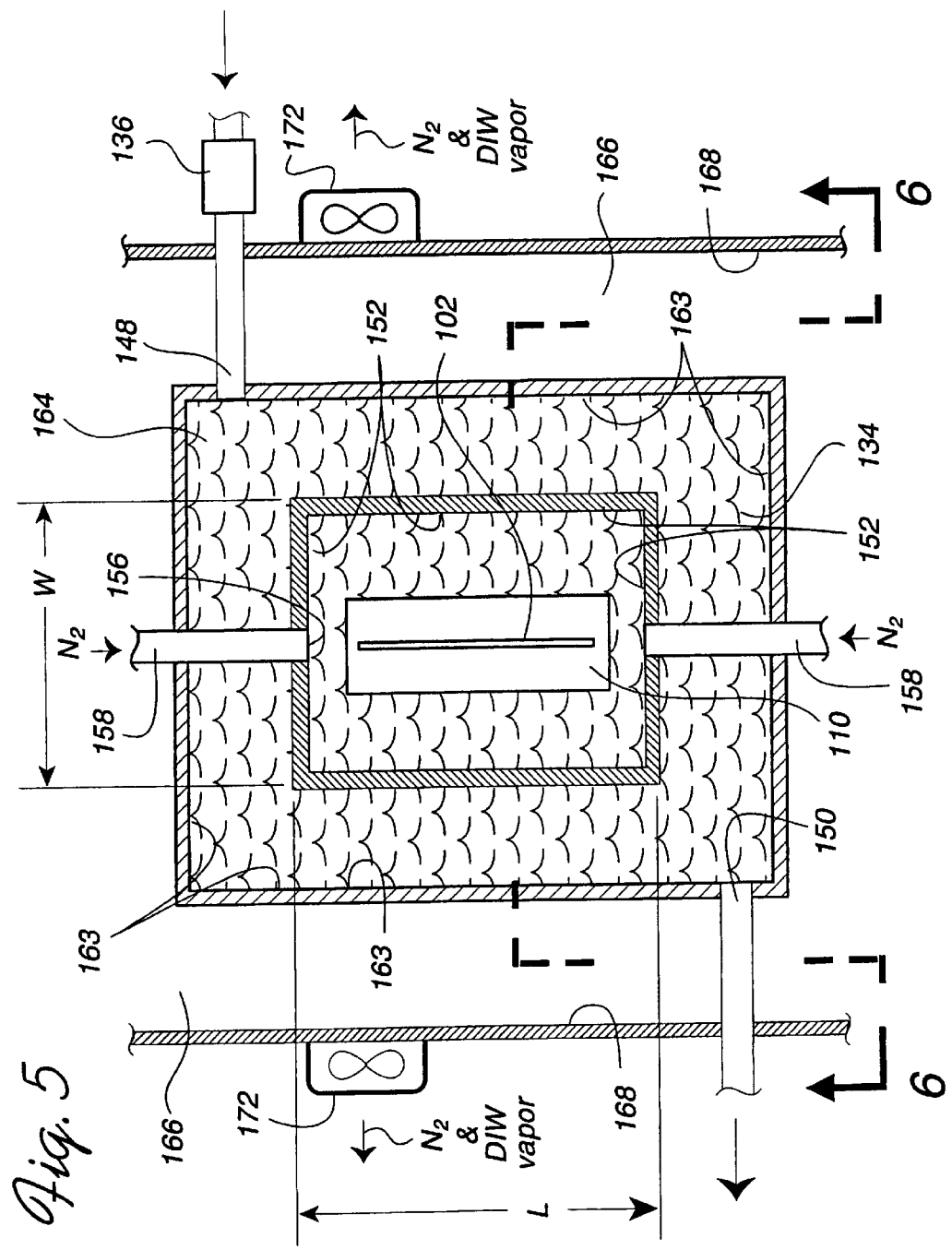
FIG. 5 is a schematic plan view taken along line 5—5 in FIG. 4A, showing a plenum into which the gas and the evaporated fluid flow from the outlet of the enclosure after drying a wafer.
Figure 6A:
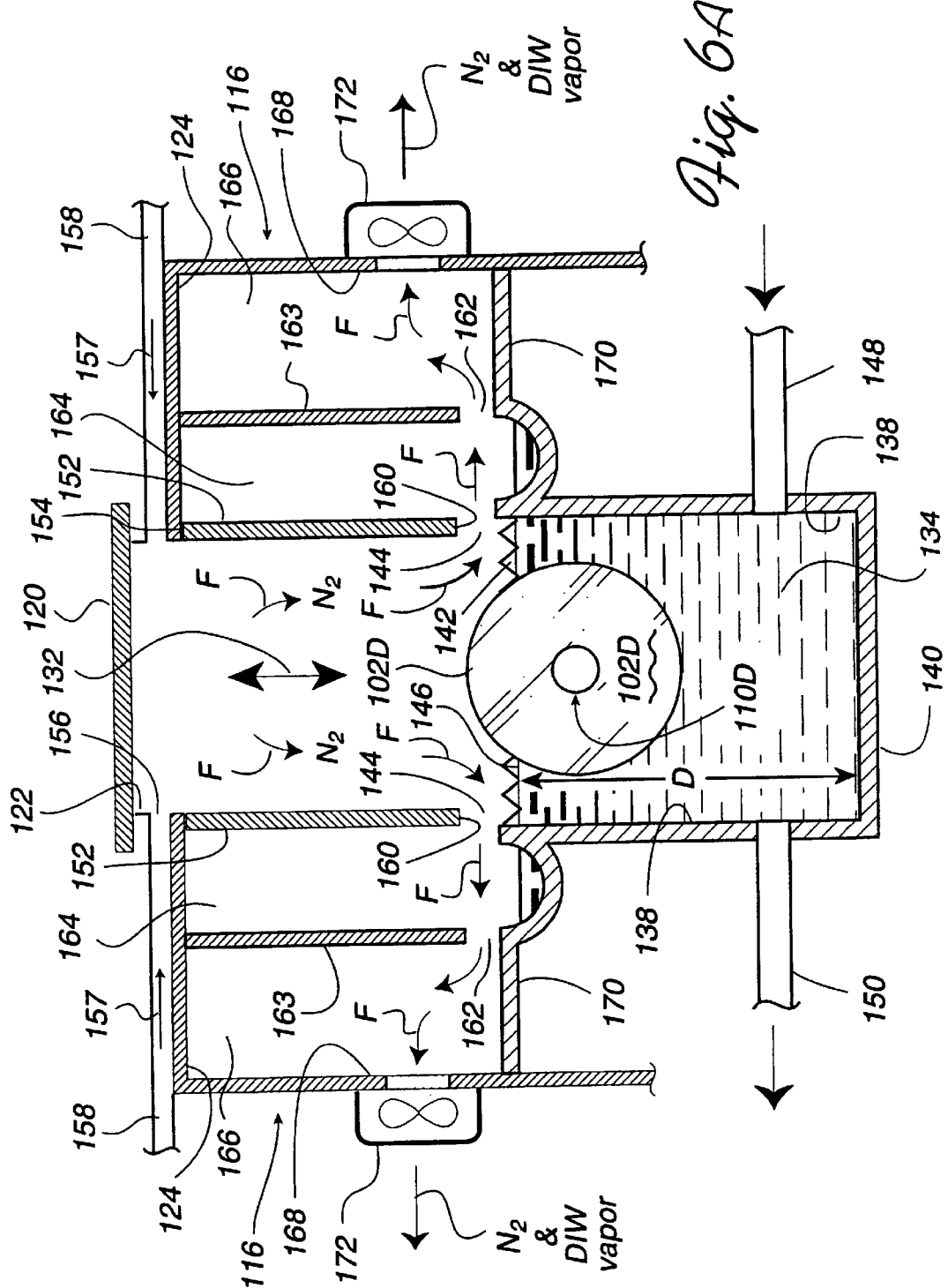
FIG. 6A is a schematic side elevational view of the apparatus viewed along line 6A—6A in FIG. 5A showing the continuous flow of heated gas in the enclosure, wherein the continuous flow is onto the disk and out of the enclosure.

FIGS. 4A, 5 and 6 schematically show that the bath 112 contains a fluid 134 such as water for operations of drying the wafers 102. FIGS. 4C, 5A and 6A schematically show that the bath 112 contains a fluid 134 such as water for operations of drying the disks 102D. Preferably, the water 134 is de-ionized. More preferably, the water 134 is both de-ionized and filtered. Most preferably, the water 134 is both de-ionized and passed through a very fine filter 136, and heated, before flowing into the bath 112. The filter 136 may be a 0.05 micron PTFE filter made by Pall Corporation. The filter 136 is designed to remove substantially all of the particles (not shown) from the fluid 134, and typically leaves in the fluid 134 less than five particles greater than or equal to 0.03 microns per cubic centimeter of the filtered fluid 134.

Four walls 138 and a bottom 140 of the bath 112 are located under the housing 116. A top 142 of each wall 138 of the bath 112 is vertically spaced from the housing 116 to define a primary gas outlet 144. An upper surface 146 of the fluid 134 in the bath 112 is spaced from the housing 116. The depth D of the fluid 134 from the upper surface 146 to the bottom 140 of the bath 112 is such that with the carrier 110 adjacent to the bottom 140 of the bath 112, the wafer(s) 102 on the carrier 110 (FIGS. 4A and 6), or the disks 102D on the carrier 110D (FIGS. 4C and 6A), may be fully immersed in the bath 112. That is, with such depth D, the fluid 134 will entirely cover the wafer(s) 102 or the disk(s) 102D and thus initially provide a uniform coating of fluid 134 on each wafer 102 or disk 102D. A fluid inlet 148 and a fluid outlet 150 are provided to enable the filtered and heated fluid 134 to be circulated into the bath 112 and then out of the bath 112 for filtering, heating and return to the bath.

The enclosure 118 is defined by two pairs of opposing walls 152. The pairs of walls 152 are joined as shown in FIGS. 5 and 5A to define a rectangular cross-section. FIGS. 6 and 6A show the tops 154 of each of the walls 152 meeting and forming an air-tight seal with the top panel 124 of the housing 116 adjacent to the opening 122. The top panel 124 thus suspends the walls 152 of the enclosure 118. The enclosure 118 defines a three-dimensional volume having a height H from the upper surface 146 of the fluid 134 to the top panel 124 of the housing 116. The respective wafer(s) 102 and disks 102D, and the carrier 110, move into and through the volume of the enclosure 118. FIGS. 5, 5A, 6 and 6A show the walls 152 of the enclosure 118 provided with gas inlets 156 connected to pipes 158 for admitting gas 157 into the enclosure 118. Because the Figures depict the wafer(s) 102 with rotational orientations different from that of the disk(s) 102D, the gas inlets 156 and the pipes 158 are also rotated to correspond to the rotational orientation of the respective wafer(s) 102 and disk(s) 102D. In this manner, the gas 157 flows against the respective edges 108 and 108D and across and parallel to the respective sides 104 and 104D of the respective wafer(s) 102 and disk(s) 102D.

The gas 157 (see arrows 157) admitted to the enclosure 118 through the gas inlets 156 may be an inert gas. The gas 157 is preferably nitrogen, and more preferably is heated nitrogen. Most preferably, the heated nitrogen gas 157 is admitted into the enclosure 118 through the gas inlets 156 under pressure, such as thirty to fifty psi (static). The anti-static device 119 (FIGS. 2 and 2A) admits nitrogen to the enclosure through an anti-static inlet 159. The device 119 creates a charge at the point at which the nitrogen is introduced into the inlet 159 to prevent static charge from existing in the enclosure 118.

Figure 4B:
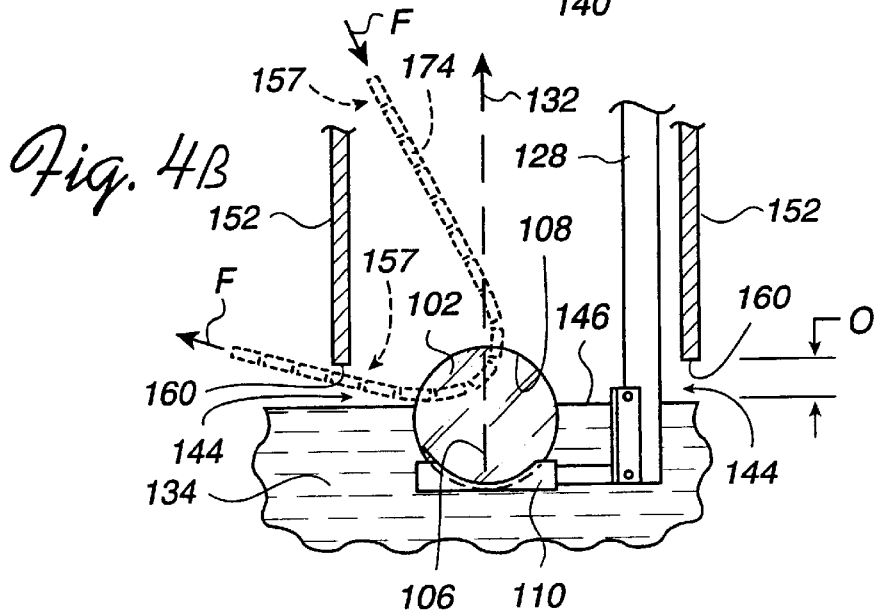
FIG. 4B is a schematic elevational view of the apparatus showing the carrier moving a wafer from the bath into a continuous flow of heated gas.
Figure 4D:
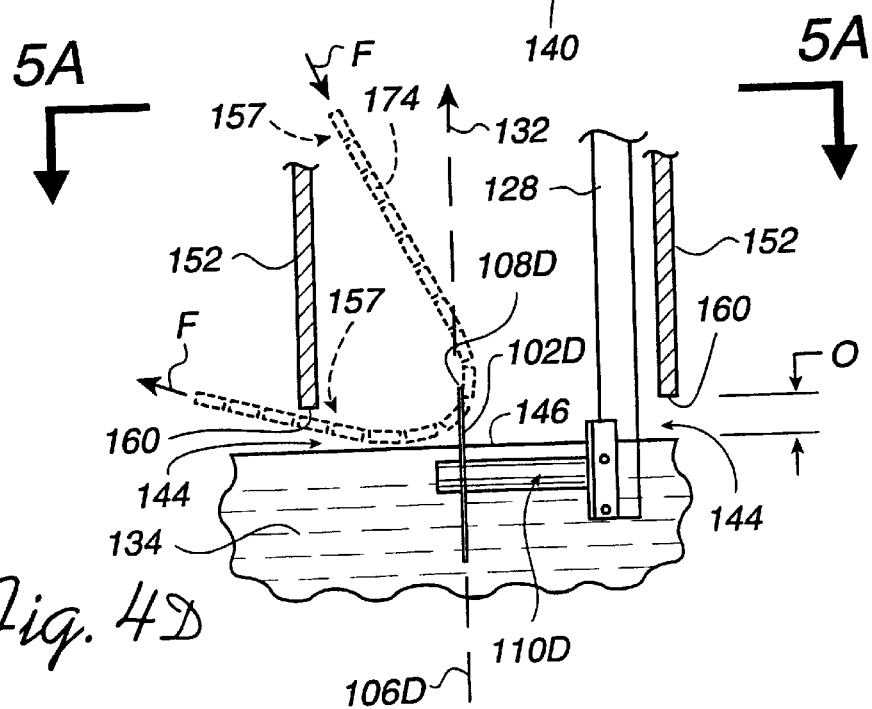
FIG. 4D is a schematic elevational view of the apparatus showing the carrier moving a disk from the bath into a continuous flow of heated gas.

Each of the walls 152 has a lower end or bottom 160 that is spaced from the upper surface 146 of the fluid 134 by a distance O (FIGS. 4B and 4D). The spaced lower ends 160 define the primary gas outlet 144 as an elongated gas outlet from the enclosure 118. The elongated outlet 144 is beneath each of the four walls 152 of the enclosure 118. Arrows F in FIGS. 4A, 4C, 6 and 6A show the flow paths of the gas 157 flowing into the enclosure 118 from the gas inlets 156 and then flowing across the opposite sides of the respective wafer(s) 102 and disk(s) 102D, and along the upper surface 146 before exiting the enclosure 118 through the elongated gas outlet 144. The walls 152 of the enclosure 118 and outer walls 163 that surround the enclosure 118 define a secondary gas outlet 162 of a gas outflow chamber 164. The gas exiting through the elongated gas outlet 144 flows into the outflow chamber 164 to the secondary outlet 162.

A plenum 166 surrounding the enclosure 118 and the bath 112 is defined by the walls 163 and outer walls 168 of the housing 116, and receives the gas exiting through the secondary outlet 162 from the outflow chamber 164. The outer housing walls 168 are laterally spaced from the walls 138 of the bath 112 and are more laterally spaced from the walls 163 of the chamber 164. The plenum 166 is closed by a lower plate 170 extending between the walls 163 of the chamber 164 and the outer walls 168 of the housing 116. The secondary outlet 162 admits the gas 157 to the plenum 166 from the outflow chamber 164, and the gas 157 is pulled from the plenum 166 and through and from the outflow chamber 164 and from the enclosure 118 by fans 172.

The pressure at which the gas 157 is admitted into the enclosure 118 and the operation of the fans 172 combine to direct the heated gas 157 so that the flow paths F are continuous. As shown in FIGS. 4A, 4C, 6, 6A, and 7, with the respective wafer(s) 102 and disk(s) 102D positioned in, or partially in, the enclosure 118, the flow paths F of the gas 157 are directed into the enclosure 118 from the gas inlets 156, flow in the enclosure 118 across the opposite sides 104 of the respective wafer(s) 102 and disk(s) 102D, flow along the upper surface 146, flow through the primary gas outlet 144, flow through the outflow chamber 164 and through the outlet 162, and flow through the plenum 166, exiting the plenum 166 by way of the fans 172. In this manner, the gas 157 admitted into the enclosure 118 does not stagnate in or otherwise accumulate in the enclosure 118. Described differently, FIGS. 4B and 4D schematically depicts many successive small volumes 174 (shown in dashed lines) of the gas 157 input to the enclosure 118. One such small volume 174 will flow (arrow F) continuously from the respective gas inlet 156 and along the above-described continuous flow path F through the enclosure 118 through the outflow chamber 164, and through the plenum 166 to the ambient air outside the housing 116.

FIGS. 1, 1A, 2, 2A, and 4B show the arm 128 that mounts the carrier 110 for movement reletive to the housing 116, and thus relative to the enclosure 118 and the bath 112 within the housing 116. A stepper motor 176 is mounted on the housing 116. Alternatively, a servo motor (not shown) may be used. The stepper motor 176 is designed to move the carrier 110 from the initial position shown in FIGS. 2 and 2A above the top panel 124 of the housing 116. At this initial position, the carrier 110 is out of the closure 118 and the bath 112, so that wafer(s) 102 may be inserted into the grooves 126, or disk(s) 102D onto the rod 127D. The wafer(s) 102 and disk(s) 102D are generally somewhat wet from a previous processing operation, but the material (not shown) that wets the wafer (s) 102 and disk(s) 102D may be on the planar side 104 and the edge 108 of the respective wafer(s) 102 and disk(s) 102D in a non-uniform manner. The stepper motor 176 is also designed to quickly move the arm 128, and thus the respective carrier 110 and 110D, and the respective wafer(s) 102 and disk(s) 102D thereon, through the opening 122, through the enclosure 118, and into the fluid 134 in the bath 112 to immerse the respective wafer(s) 102 and disk(s) 102D in the fluid 134 as described above. When immersed in the fluid 134, the planar sides 104 and the edges 108 of the respective wafer(s) 102 and disk(s) 102D are now not wet in a uniform manner, but the very clean, filtered and heated fluid 134 to condition the respective wafer(s) 102 and disk(s) 102D for being dried.

Figure 7:
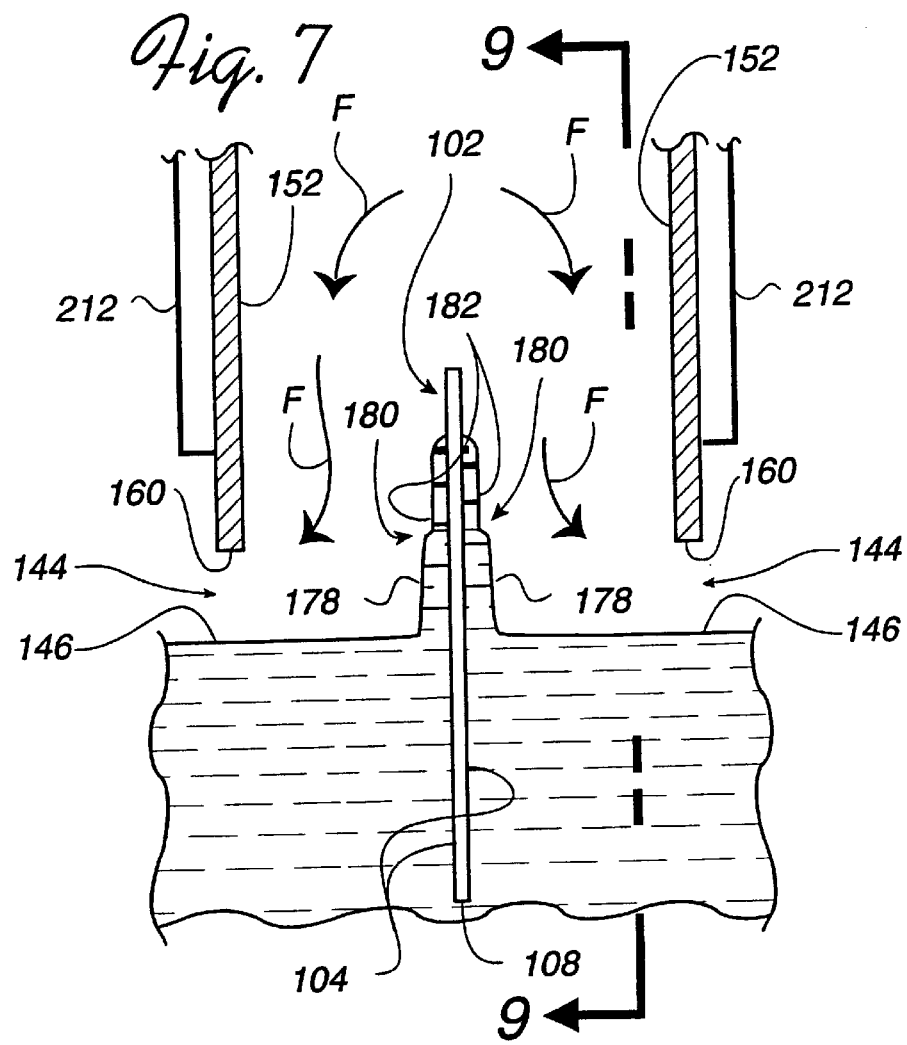
FIG. 7 is an enlarged view of a portion of FIG. 6 showing that by controlling the rate at which the wafer is removed from the bath a meniscus will form on each side of the wafer, and above the meniscus a uniform thin film will remain to be dried off the wafer according to the present invention.
Figure 8:
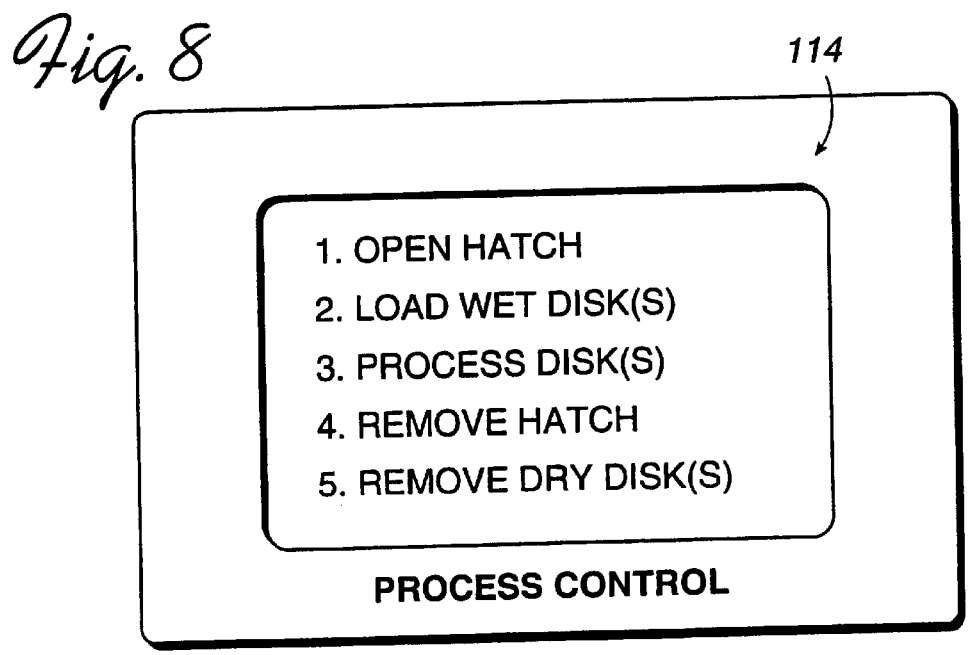
FIG. 8 is a diagram of a control panel for operating the apparatus for drying wafers.
Figure 9:
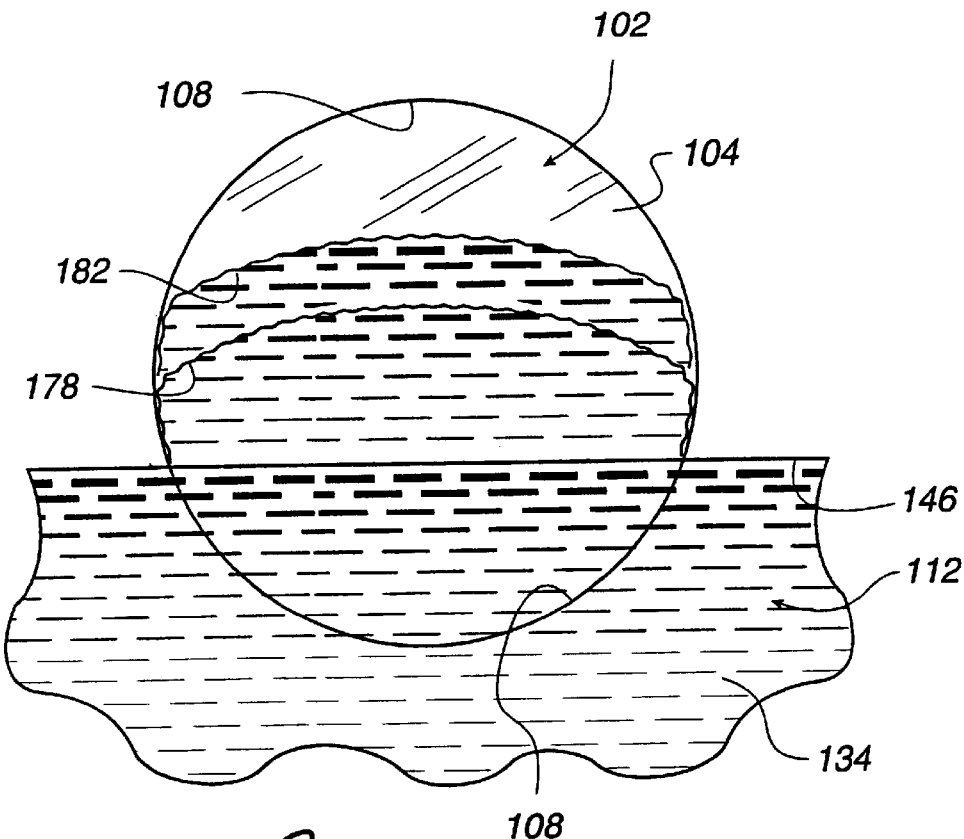
FIG. 9 is an enlarged partial side elevational view taken along line 9—9 in FIG. 7 showing a planar side of the wafer with the meniscus formed, and with the uniform thin film remaining on the wafer above the meniscus.

Importantly, the stepper motor 176 is also designed to move the arm 128 upwardly as shown in FIGS. 4B, 4D, 7 and 9, to separate the respective wafer(s) 102 and disk(s) 102D, and the bath 112. Such separation is preferably by moving the carrier 110 and the respective wafer(s) 102 and disk(s) 102D upwardly out of the bath fluid 134. Such movement results in an increasingly large portion 177 of the respective wafer(s) 102 and disk(s) 102D being out of the fluid 134. FIGS. 7 and 9 depict the respective wafer(s) 102 (and not the disk(s) 102D) moving out of the fluid 134. For ease of description, the disk(s) 102D are not separately described moving out of the fluid 134. However, the following description of the wafer(s) 102 also applies to the disk(s) 102D.

As the wafer(s) 102 move out of the fluid 134, a meniscus 178 (shown by a dash-dot-dash line) is formed between the upper fluid surface 146 and each of the opposite planar sides 104 of the wafer 102. The meniscus 178 extends upwardly from the upper surface 146 and is in effect a localized vertically extending section of the fluid 134 located above the upper surface 146. The meniscus 178 terminates at a rounded nose 180 (FIG. 7). Additionally, as the wafer(s) 102 are moved upwardly and are separated from the fluid 134, a thin film, or monolayer, 182 (shown by a dash-dot-dot line), of the fluid 134 forms and is retained on each respective side 104 and 104D of the wafer(s) 102 above the meniscus 178. The formation of the meniscus 178, and the resulting thin film 182 retained on the sides 104 of the wafer 102, are desirable in that the thin films 182 of the fluid 134 on the planar sides 104 are of uniform thickness, and promote efficient removal of the thin film 182 according to the present invention. As a result, each portion 177 of the side 104 having the thin film 182 thereon is uniformly wet by the fluid 134.

To increase the number of wafer(s) 102 that may be processed per hour using the apparatus 100 and methods of the present invention, a rate of upward movement of the stepper motor 176 may be selected over a range of from one to six inches per minute. This rate of movement is selected according to the characteristics of the (a) respective wafer(s) 102 or disk(s) 102D that are to be carried in the carrier 110, and (b) fluid 134 in the bath 112. More particularly, for each combination of wafer(s) 102 or disk(s) 102D, and fluid 134, there is a maximum rate of movement of the respective wafer(s) 102 or disk(s) 102D out of the bath 112 at which the meniscus 178 and the thin film 182 of fluid 134 will form on each respective side 104 or 104D of the respective wafer(s) 102 or disk(s) 102D. It is undesirable for the stepper motor 176 to move the carrier 110 out of the bath 112 at a rate greater than this maximum rate of movement of the respective wafer(s) or disk(s) 102D out of the bath. In detail, if this rate is exceeded, then the meniscus 178 may not form and any fluid 134 retained on the respective wafer 102 or disk 102D as the respective wafer 102 or disk 102D exits the fluid 134 may be non-uniform, such as not extending completely across the respective wafer 102 or disk 102D, or being non-uniform in thickness. Such non-uniform fluid 134 may evaporate non-uniformly and may leave an unacceptable level of residue and stains.

Efficient removal of the fluid 134 from the respective wafer(s) 102 and disk(s) 102D is achieved by the transfer of thermal energy to the respective wafer(s) 102 and disk(s) 102D to the thin film 182 of fluid 134 as the respective wafer(s) 102 and disk(s) 102D, and the bath 112, are separated. As described above, such separation is preferably by moving the respective wafer(s) 102 and disk(s) 102D from the bath 112 into and through the enclosure 118. An initial input of thermal energy to the respective wafer(s) 102 and disks 102D is from the heated fluid 134 in the bath 112.

Figure 10:
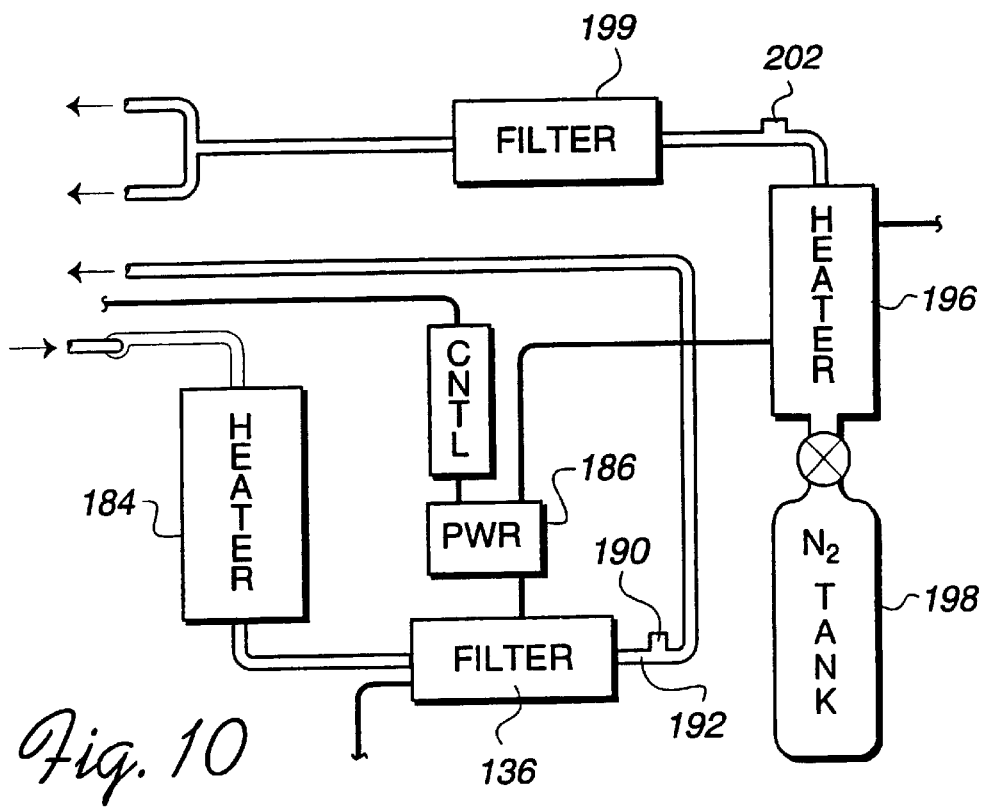
FIG. 10 is a schematic diagram of a system for supplying fluid, gas, and power to the apparatus for drying wafers and disks.

FIG. 10 shows that after the fluid 134 exits from the bath 112 a pump 183 directs the fluid 134 through a heater 184 that is supplied with energy by a power supply 186. The heater 184 may be an electrical resistance heater, for example, and the power supply 186 may supply 110V or 220V to the heater 184. The temperature to which the heater 184 heats the filtered fluid 134 may be adjusted based on the reading of a "DI PROCESS TEMP" gauge 188 on the operating panel 114, where "DI" indicates that the fluid 134 may be de-ionized water. The DI TEMP gauge 188 has a temperature sensor 190 attached to an outlet 192 of the filter 136. The heater 184 heats the fluid 134 so that the temperature of the fluid 134 in the bath 112 is a preferred temperature, such as in the range from 160 degrees F. to 190 degrees F. More preferably, the temperature of the fluid 134 in the bath 112 is in the range from 175 degrees F. to 185 degrees F. Most preferably, the temperature of the fluid 134 in the bath 112 is in the range from 178 degrees F. to 185 degrees F. For convenience, a "DI PROCESS TEMP LIMIT" gauge 194 is provided on the operating panel 114 to indicate whether the temperature of the fluid 134 in the bath 112 exceeds a preferred temperature. After the fluid 134 is heated the fluid flows through the filter 136 for return to the bath 112.

As described below, during a wafer-drying or disk-drying cycle, the respective wafer(s) 102 and disk(s) 102D are immersed in the fluid 134 in the bath. The period of time of immersion is selected so as to transfer thermal energy to the respective wafer(s) 102 and disk(s) 102D sufficient to provide, at the time the carrier 110 starts to move the respective wafer(s) 102 and disk(s) 102D out of the bath 112, a temperature of the surface of the respective wafer(s) 102 and disk(s) 102D about the same or somewhat lower than the temperature of the fluid 134 adjacent to the upper surface 146 of the bath 112. In particular, the surface temperature of the respective wafer 102 and disk 102D may be from about 160 degrees F. to about 190 degrees F. More preferably, such temperature of the respective wafer(s) 102 and disk(s) 102D may be in the range from about 175 degrees F. to about 185 degrees F. Most preferably, such temperature of the respective wafer(s) 102 and disk(s) 102D is in the range from about 178 degrees F. to about 185 degrees F.

A further input of thermal energy to the respective wafer(s) 102 and disk(s) 102D, and to the thin films 182 on the respective wafer(s) 102 and disk(s) 102D, is from the heated gas 157 flowing in the enclosure 118. In particular, FIG. 10 shows that the gas 157 receives thermal energy from a gas heater 196 connected to a gas tank 198, such as a nitrogen tank containing nitrogen under pressure, such as eighty psi.(static). The gas heater 196 is supplied with energy from the power supply 186. The heater 196 may be an electrical resistance heater, for example. The temperature to which the gas heater 196 heats the gas 157 may be adjusted based on the reading of an "N2 PROCESS TEMP" gauge 200 on the operating panel 114. The N2 PROCESS TEMP gauge 200 has a temperature sensor 202 attached to an outlet of the gas heater 196. The gas heater 196 heats the gas so that the temperature of the gas 157 entering the enclosure 118 is a preferred temperature, such as in the range from 260 degrees F. to 400 degrees F. More preferably, the temperature of the gas 157 entering the enclosure 118 is in the range from 290 degrees F. to 360 degrees F. Most preferably, the temperature of the gas 157 entering the enclosure 118 is in the range from 315 degrees F. to 350 degrees F. For convenience, a "N2 PROCESS TEMP LIMIT" gauge 204 is provided on the operating panel 114 and is connected to a temperature sensor 206 to indicate whether the temperature of the gas 157 entering the enclosure 118 exceeds the preferred temperature. From the heater 196 the heated gas 157 flows through a filter 199. The gas heater 196 assures that as the gas 157 initially enters the enclosure 118 through the gas inlets 156, the gas 157 is at a high enough temperature to transfer thermal energy to the respective wafer(s) 102 and disk(s) 102D, and to the thin films 182 on the respective wafer(s) 102 and disk(s) 102D, as described below. A "N2 TEMP IN CHAMBER" gauge 208 is provided on the operating panel 114 for indicating the temperature of the gas 157 in the enclosure 118, as sensed by a temperature sensor 210, and facilitates adjustment of the gas heater 196.

A further input of thermal energy to the respective wafer(s) 102 and disk(s) 102D, and to the thin films 182 the respective wafer(s) 102 and disk(s) 102D, is from the enclosure 118. FIG. 7 shows that the walls 152 of the enclosure 118 are provided with flat heaters 212 that maintain the temperature of the walls 152 from about 160 degrees F. to about 400 degrees F. More preferably, such temperature of the walls 152 is in the range from about 190 degrees F. to about 300 degrees F. Most preferably, such temperature of the walls 152 is in the range from about 220 degrees F. to about 250 degrees F. The wall temperature, i.e., the temperature to which the heater 212 heats the walls 152, may be adjusted based on the reading of a "CHAMBER TEMP HEATER" gauge 214 on the operating panel 114. The CHAMBER TEMP HEATER gauge 214 is connected to a temperature sensor 216 attached to one of the walls 152 of the enclosure 118. Readings of the CHAMBER TEMP HEATER gauge 214 facilitate adjusting the power to the enclosure heater 212.

With the walls 152 of the enclosure 118 at the selected temperature, the gas 157 flowing in one or more of the continuous flow paths F in the enclosure 118 may contact the walls 157 and receive thermal energy. In this manner, upon contact of the gas 157 with the walls 152, the temperature of the gas 157 in the continuous flow paths F is maintained at a preferred temperature. This preferred temperature is about from about 160 degrees F. to about 210 degrees F. More preferably, such temperature of the flowing gas 157 is in the range from about 176 degrees F. to about 200 degrees F. Most preferably, such temperature is in the range from about 185 degrees F. to about 196 degrees F.

With the walls 152 of the enclosure 118 at the selected temperature, the walls 152 also transfer radiant thermal energy to the respective wafer(s) 102 and disk(s) 102D, and to the thin films 182 on the respective wafer(s) 102 and disk(s) 102D as the respective wafer(s) 102 and disk(s) 102D are moved from the bath 112 into and through the enclosure 118. The radiant thermal energy helps assure that the temperature of the respective wafer(s) 102 and disk(s) 102D, and of the thin films 182 on the respective wafer(s) 102 and disk(s) 102D does not decrease as the respective wafer(s) 102 and disk(s) 102D are moved from the bath 112 into and through the enclosure 118. Master control of the stepper motor 176, and of the heaters 184, 196 and 212, is via a power ON/OFF switch 218 or an emergency switch 220, each of which controls the power supply 186.

Figure 11:
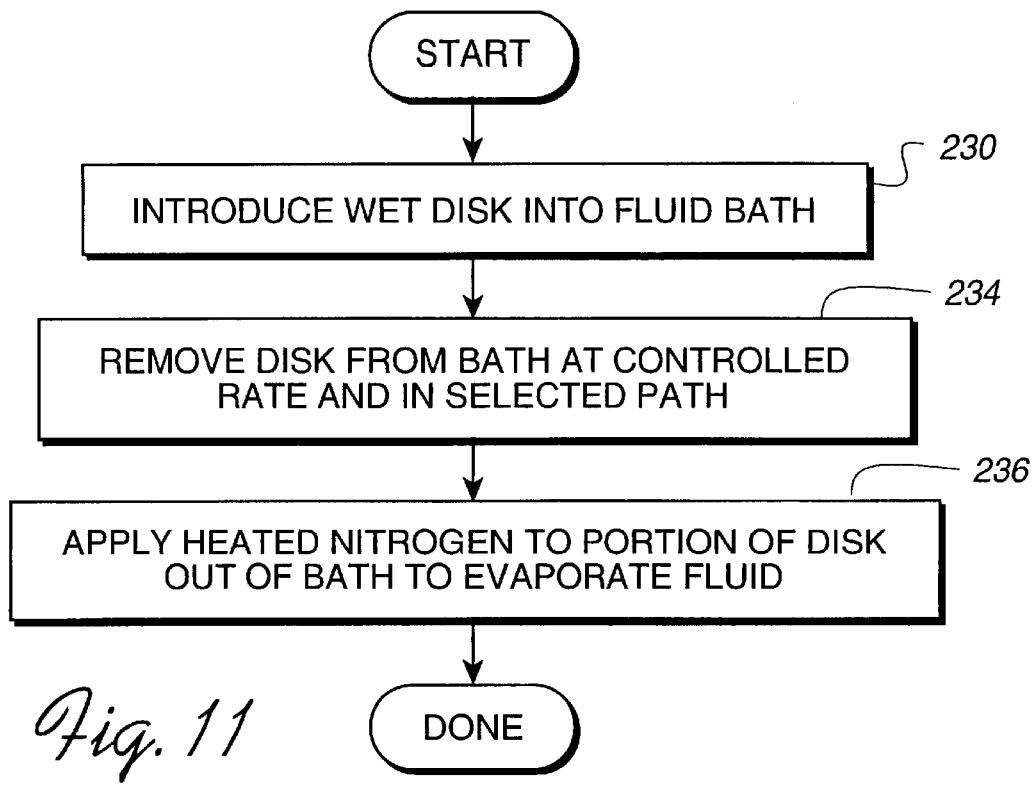
FIG. 11 is a diagram of a flow chart illustrating operations in one embodiment of a method for drying disks according to the principles of the present invention.

FIG. 11 shows a flow chart illustrating operations of one embodiment of a method for drying exemplary disk(s) 102D according to the principles of the present invention). It is to be understood that the wafer(s) 102 may be dried by using the same operations of a wafer drying cycle as are described below for a disk drying cycle with respect to the disk(s) 102D.

The disk drying cycle of the method starts by an operation 230 of introducing the disk (s) 102D into the fluid bath 112. As described below, the disk(s) 102D are generally received somewhat wet from the previous processing operation, but the material that wets the disk(s) 102D is not on the planar sides 104 of the disk(s) 102D in a uniform manner. The process control panel 114 provides an instruction "1" to open the hatch, and the hatch 120 is removed to expose the opening 122 in the housing 116. The heater 184 for the fluid 134 is turned on and the temperature of the fluid 134 is set as described above. The carrier 110D is positioned by the stepper motor 176 in the UP position, out of the enclosure 118 to expose the grooves 126 to receive the disk(s) 102D.

As appropriate, the next process control instruction "2" (LOAD WET DISKS) is followed by mounting one or more disk(s) 102D onto the rod 127D of the carrier 110D. With the hatch 120 still removed, the carrier 110D with the disk(s) 102D loaded thereon is moved by the stepper motor 176 downwardly at a relatively rapid rate to lower the disk(s) 102D into the fluid 134 in the bath 112. The carrier 110D is lowered until the carrier 110D is in a DOWN position, located adjacent to the bottom 140 of the bath 112 with the disk(s) 102D on the carrier 110D fully immersed in the fluid 134. At this time, the hatch 120 is placed on the top panel of the housing to close the enclosure 118, and operation 230 is complete.

Operation 234 performs the next instruction "3" on the process control panel 114. Instruction "3" is PROCESS DISKS. Operation 234 is performed by turning on the heater 212 for the enclosure 118, and the temperature of the walls 152 is set as described above. Also, the DIW heater 184 and the gas heater 196 are turned on and set as described above. According to the characteristics of the disk(s) 102D and of the fluid 134, the process control panel 114 controls the rate of upward movement of the stepper motor 176 so that such rate is the maximum rate of movement of the disk(s) 102D out of the fluid 134 at which the meniscus 178 and the thin film 182 of fluid 134 will form on the sides 104D of the disk(s) 102D. Such rate may be referred to as a controlled rate, for example. The carrier 110D moves the disk(s) 102D along the selected (disk drying) path 132 in the enclosure 118, which is a vertical path.

As the disk(s) 102D is moved out of the bath 112, operation 236 is performed by flowing the hot nitrogen gas 157 in the flow path F to apply the nitrogen 157 to the uniformly wet portion(s) 177 of the disk(s) 102D that are out of the fluid 134. The hot nitrogen 157, in combination with the thermal energy from the walls 152 of the enclosure 118, keep the disk(s) 102D and the thin films 182 at the desired temperature for evaporating the thin films 182 from the opposing sides 104 of the disk(s) 102D. Because the height H of the enclosure 118 is selected so as to provide adequate distance in which the disk(s) 102D move as the thin films 182 are evaporated from the sides 104, all of the fluid 134 of the thin films 182 is evaporated from the sides 104 of all of the disk(s) 102D before the disk(s) 102D reach the top panel 124 of the housing 116. Operation 236 is completed by performing instruction "4" to remove the hatch 120 and instruction "5" to remove the dry disk(s) 102D from the carrier 120. The method described in FIG. 11 is thus DONE.

Figure 12:
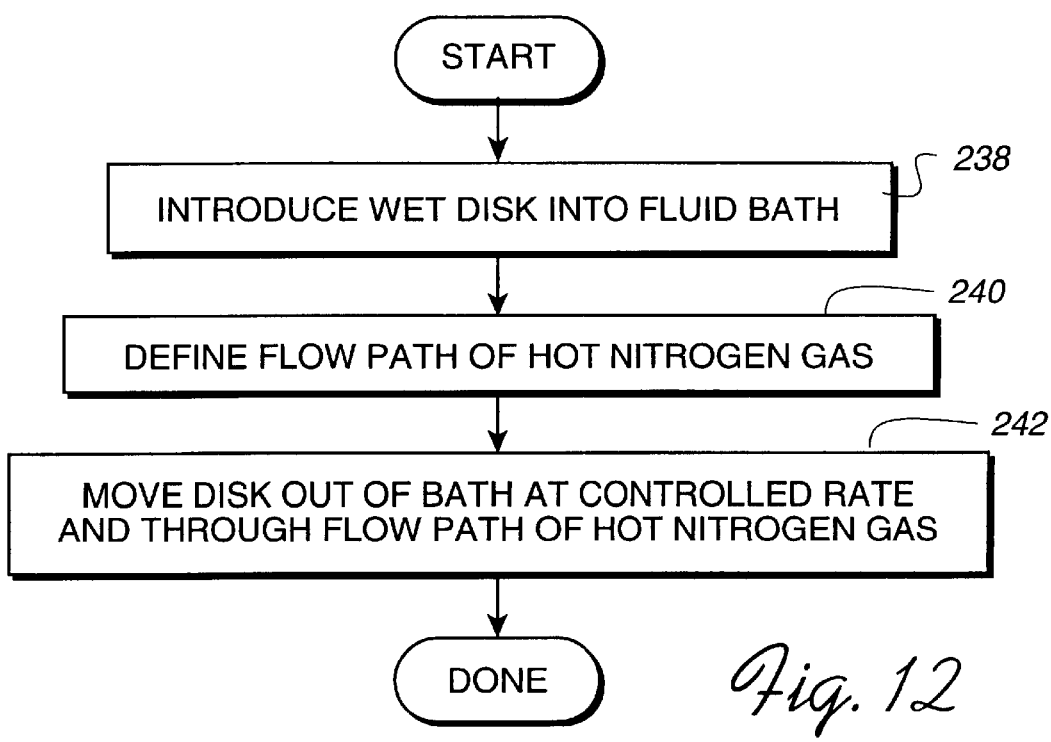
FIG. 12 is a diagram of a flow chart illustrating operations in another embodiment of a method for drying disks according to the principles of the present invention.

FIG. 12 shows a flow chart illustrating operations of another embodiment of a method for drying the disk(s) 102D according to the principles of the present invention. It is to be understood that the wafer(s) 102 may be dried by using the same operations of a wafer drying cycle as are described below with respect to FIG. 12 for a disk drying cycle for the disk(s) 102D.

The disk drying cycle of the method of FIG. 12 starts by an operation 238 of introducing the disk(s) 102D into the fluid bath 112, which is essentially the same as operation 230 described above.

The next instruction on the process control panel is "3", PROCESS DISKS, which is performed in operations 240 and 242. In operation 240, the flow path F of the hot nitrogen gas 157 is defined. The defining operation 240 may be performed by providing the closed enclosure 118 as described above, including for example the gas inlet(s) 156, the primary outlet 144, and the secondary outlets 162. Operation 240 also provides the plenum 166 and the fan(s). The hot nitrogen 157 is supplied from the tank 198 and the gas heater 196 to the gas inlet(s) 156. The temperature of the hot nitrogen 176 is set as described above. The fan(s) 172 are turned on. In this manner, the flow paths F of hot nitrogen 176 are established in the enclosure 118. As described above, each of the flow paths F is from the gas inlet 156, across the opposite sides 104 of the disk(s) 102D, along the upper surface 146 of the fluid 134, through the primary gas outlet 144, through the outflow chamber 164, through the secondary outlet 162, and through the plenum 166, exiting the plenum 166 by way of the fans 172. By each such flow path F, which is continuous, the flow of gas 157 admitted into the enclosure 118 does not stagnate in the enclosure 118, or become discontinuous, or otherwise accumulate in the enclosure 118. With the flow path F defined the "3" instruction (PROCESS DISK(S)) continues by performing operation 242 in which the disk(s) 102D is moved out of the bath 112 at a controlled rate and through the flow paths F of hot nitrogen gas 157. The heater 212 for the enclosure 118 is turned on and the temperature of the walls 152 is set as described above. According to the characteristics of the disk(s) 102D and of the fluid 134, the process control panel 114 controls the rate of upward movement of the stepper motor 176 so that such rate is the maximum rate of movement of the disk(s) 102D out of the bath 112 at which the meniscus 178 and the thin film 182 of fluid 134 will form on the sides 104 of the disk(s) 102D. Such rate may be referred to as a controlled rate, for example.

As the disk(s) 102D is moved out of the bath 112, the hot nitrogen 157 flowing in the flow paths F keeps the disk(s) 102D and the thin films 182 at the desired temperature for evaporating the thin films 182 from the opposing sides 104 of the disk(s) 102D as the disk 102D exits the fluid 134. Because the height H of the enclosure 118 is selected so as to provide adequate distance in which the disk(s) 102D may move as the thin films 182 are evaporated from the sides 104, and because the fluid 134 of the thin films 182 is rapidly evaporated from the sides 104D of all of the disk(s) 102D, the evaporation is complete before the disk(s) 102D reach the top panel 124 of the housing 116. Further, via control of the speed of the fans 172 and hence control of the rate of flow of the gas 157 in the continuous flow paths F, the continuous flow paths F control the relative humidity in the enclosure 118 by causing the fluid 134 evaporated from the disk 102D, and causing any fluid 134 that has vaporized from the bath 112, to directly exit the enclosure 118 and not remain in the enclosure 118 for respective possible recondensation or condensation on the disk 102D. Such control may provide relative humidity in the enclosure 118 under about forty percent, and more preferably from about forty percent to about thirty percent. Most preferably, the relative humidity may be about thirty percent. Thus, by controlling the relative humidity in the hot enclosure 118, recondensation of the evaporated thin film 182 and condensation of vapor from the bath 112 onto the disk 102D are inhibited.

The stepper motor 176 is then stopped, and the next instruction "4", REMOVE HATCH, is performed to open the opening 122. To complete operation 242, the next instruction ("5") on the process control panel, REMOVE DRY DISK(S), is performed. The now-dry disk(s) 102D are removed from the carrier 110D, and the carrier 110D is thus ready to be loaded with disk(s) 102D for the next drying operation. The method described in FIG. 12 is thus DONE.

As noted, prior to the present invention, there was a need for apparatus and methods of efficiently drying the disk(s) 102D. The efficient drying resulting from use of the present invention allows the disk(s) 102D to be separated from the fluid 134 at the described selected rate which is no more than the maximum rate at which the thin film 182 and the meniscus 178 will form between the fluid bath 134 and the sides 104 of the disk 102D. As a result, the overall period of time taken in the typical drying cycle described with respect to FIG. 12 may not exceed about two minutes. To not exceed such time period, the drying cycle rapidly removes from the disk(s) 102D the thin films 182 of the fluid 134 that are uniformly formed on the sides 104 of the disk(s) 102D as the disk(s) 102D and the bath 112 are separated. As described above, "rapidly" means that such removal occurs before the disk(s) 102D and the bath 112 have been separated enough to have the top of the disk(s) 102D hit the top panel 124 of the housing 116 as the carrier 110D moves upwardly in the enclosure 118.

In review, then, the present invention fills these needs by providing the apparatus 100 and the described methods of efficiently removing the fluid 134 from the wafers 102 and the disks 102D. For example, considering the disk(s) 102D, the efficient removing uniformly wets the disk(s) 102D in the fluid bath 112, so that a consistent starting condition of the disks 102D is provided regardless of the type of prior processing of the disk(s) 102D. In addition, the efficient removing is attained by defining a gas-filled volume, which is provided by the hot enclosure 118 that continuously transfers thermal energy to the disk(s) 102D in the volume. The disk(s) 102D and the bath are separated at the controlled rate to form the thin layers 182 of fluid 134 on the disk(s) 102D as the disk(s) 102D are positioned in the gas-filled volume defined by the enclosure 118. Further, the hot gas 157 directed into the volume and across the disk(s) 102D and out of the volume continuously transfers thermal energy to the disk(s) 102D. Since the fluid 134 is not drained from the bath 112 to enable flow of the gas 157 from the enclosure 118, for example, the directing of the hot gas 157 out of the volume is not only continuous, but independent of the separation of the bath 112 and the disk 102D. With the thin films 182 formed uniformly on the planar sides 104D, and with the thin films 182 provided with thermal energy as the disks 102D move up in the enclosure, the thermal energy transferred to the disk(s) 102D in the volume rapidly evaporates the thin film 182 from the disk(s) 102D without decreasing the rate of separation of the disk(s) 102D and the bath 112 below the maximum rate of such separation at which the meniscus 178 will form between the bath 112 and the sides 104D of the disk 102D during such separation. As described, such efficient removing enables the disk throughput of such apparatus 100 and method to be limited only by the type of disk 102D that is being dried, and the type of fluid 134 used to wet the disk 102D. Thus, reliance is not placed on the thermal energy stored in a given disk 102D to provide all of the thermal energy necessary to evaporate fluid 134 from the disk 102D. Such efficient removing also involves controlling the relative humidity in the enclosure 118 to be low to inhibit recondensation of the fluid 134 on the disks 102D Therefore, the described problems with the prior art dryers are avoided.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A disk drying system, comprising:
   a bath enclosure configured to hold a fluid, the fluid having a top surface; and
   a temperature-controlled chamber defined above the fluid surface, said fluid surface defining the bottom of said chamber, said chamber having a wall structure including a first gas exhaust opening proximate to the fluid surface and a second gas inlet opening spaced above said first opening to define a continuous gas flow path from said inlet down through said chamber, across at least a portion of said surface and out said exhaust opening.
2. A system according to claim 1, further comprising:
   a heater for maintaining the wall structure at a selected temperature to provide energy to the chamber.
3. A system according to claim 1, further comprising:
   a hot gas supply system connected to the second gas inlet opening providing said gas flow path as hot gas flowing into and through the chamber, out the first opening, and away from the fluid surface.
4. A system according to claim 1, wherein the disk has opposite planar sides that are parallel to a planar axis; the system further comprising:
   a disk transport unit for immersing the disk in the fluid with the planar axis generally perpendicular to the fluid surface; and
   said disk transport unit includes a drive to move the disk out of the fluid, while maintaining the planar axis generally perpendicular to the fluid surface, at a controlled rate into the chamber to a position completely above the first gas exhaust opening, the disk transport unit controlling the drive rate to permit formation of a meniscus between the fluid surface and each of the opposite planar sides of the disk and a continuous thin layer of fluid above the meniscus on at least a portion of each of the planar sides, each of the portions being out of the fluid.
5. A system according to claim 4, the system further comprising:
   a heat transfer system for transferring energy to the disk and into the thin layers as the disk is moved at the controlled rate in the chamber.
6. A system according to claim 5, the heat transfer unit further comprising:
   a hot gas supply system connected to the second gas inlet opening providing a flow of hot gas through the chamber across the opposite planar sides of the disk and out of the chamber through the first gas exhaust opening to transfer energy at a selected temperature to said thin layers.
7. A system according to claim 5, the heat transfer unit further comprising:
   a heater connected to the chamber between the first and second openings providing energy to said chamber wall structure.
8. A system according to claim 6, the heat transfer unit further comprising:
   a heater connected to the chamber between the first and second openings providing energy to said chamber wall structure;
   the energy from the hot gas and from said chamber wall structure is selected to be sufficient to evaporate the thin layer of fluid from said portion of each of the opposite planar sides of the disk.
9. A system according to claim 8, further comprising:
   at least one plenum associated with and external of the chamber for receiving exhaust gas and thin layer evaporate from said first gas exhaust opening; and
   at least one fan for exhausting gas and the thin layer evaporate from the at least one plenum to control the relative humidity in the chamber.
10. A system according to claim 8, further comprising:
    an operating control system that maintains the hot gas supply and the heater within selected temperature limits, and controls operation of the drive.
11. A system according to claim 8, wherein the fluid held in the bath enclosure is deionized water.
12. A system according to claim 4, wherein said wall structure includes at least two walls, the first gas exhaust opening is provided in at least one of the at least two walls.
13. A system according to claim 12, wherein the opposite planar sides of the disk are spaced by an edge, and in which:
    the disk transport unit is configured to simultaneously move a plurality of spaced disks;
    the at least two walls of the wall structure are defined by a plurality of walls, two of the walls are generally parallel to the sides of disks moved by the disk transport unit;

each of two other of the walls is generally perpendicular to the opposite sides of the disks; and at least one of said walls has at least a portion of a lower end thereof spaced above the top fluid surface to define the first gas exhaust opening, the first gas exhaust opening extends around a plurality of the spaced disks moved by the disk transport unit so that the flow path extending from the second gas inlet along the at least a portion of the top fluid surface and through the first gas exhaust opening flows across the plurality of disks and under the at least a portion of the lower end of said at least one of said walls.

14. A system according to claim 13, wherein the first gas exhaust opening is provided in at least two walls of the plurality of walls.

15. A system according to claim 14, wherein the first gas exhaust opening is provided in the two parallel walls and in the two other walls forming a perimetral gas exhaust opening around all said plurality of disks.

16. A method for drying a disk, comprising the operations of:

immersing a disk in a fluid bath to wet opposite sides of the disk with the fluid;

moving the disk out of the fluid bath at a selected rate into a defined volume along a selected path, the rate of disk motion being selected to form a meniscus and a thin film of the fluid on the opposite sides of the disk as the disk moves from the fluid bath;

flowing heated gas into contact with the sides of the disk as the disk is moved along the selected path out of the fluid bath to assist the evaporation of the thin film of the fluid from the disk; and exhausting the heated gas containing evaporated thin film vapor.

17. A method according to claim 16, further comprising the operation of:

radiating energy onto the disk as the disk moves along the selected path out of the fluid bath.

18. A method according to claim 17, wherein:

the immersing operation includes positioning a plurality of disks in the fluid bath to wet the opposite sides of each of the disks with the fluid;

the moving operation includes defining the selected path generally parallel to the sides of the disks; and the flowing operation includes flowing heated gas along each side of each of the disks.

19. A method according to claim 16, wherein the heated gas is hot nitrogen, the flowing operation further comprising the operations of:

flowing the hot nitrogen into contact with the sides of the disk to assist the evaporation of the thin film of the fluid from the disk into the hot nitrogen; and exhausting the hot nitrogen containing evaporated thin film vapor away from the fluid bath.

20. A method according to claim 16, wherein the operation of flowing heated gas further comprises:

controlling the relative humidity in the defined volume as the disk is moved along the selected path and out of the fluid bath.

21. A method according to claim 16, wherein the selected rate is not more than a maximum rate at which the meniscus and the thin film will form on the opposite sides of the disk as the disk moves from the fluid bath.

22. A method according to claim 21, wherein the selected rate is in a range from about one inch per minute to about six inches per minute.

23. A method according to claim 16, wherein the fluid in the fluid bath is deionized water.

24. A method according to claim 16, further comprising the operation of:

maintaining a temperature of the fluid in the fluid bath in the range of about 175 to about 190 degrees F.

25. A method according to claim 24, further comprising the operation of:

introducing the heated gas into the defined volume at a temperature that exceeds a lowest temperature of the range by at least about 85 degrees F.

26. A method according to claim 16, further comprising the operation of:

maintaining a temperature of the fluid in the fluid bath in the range of about 175 to about 185 degrees F.

27. A method according to claim 16, further comprising the operation of:

maintaining a temperature of the fluid in the fluid bath in the range of about 178 to about 185 degrees F.

28. A method according to claim 16, further comprising the operation of:

at the time the moving operation commences moving the disk out of the fluid bath, providing the temperature of the opposite sides of the disk about the same as the temperature of the fluid in the fluid bath.

29. A method according to claim 16, further comprising the operation of:

maintaining the temperature of the heated gas in the range of about 160 to about 210 degrees F.

30. A method according to claim 16, further comprising the operation of:

maintaining the temperature of the heated gas in the range of about 176 to about 200 degrees F.

31. A method according to claim 16, further comprising the operation of:

maintaining the temperature of the heated gas in the range of about 185 to about 196 degrees F.

32. A method according to claim 16, further comprising the operations of:

enclosing the heated gas in the defined volume that is defined at least partially by an enclosure surface; and maintaining the temperature of the enclosure surface in the range of about 160 to about 400 degrees F.

33. A method according to claim 16, further comprising the operations of:

enclosing the heated gas in the defined volume that is defined at least partially by an enclosure surface; and maintaining the temperature of the enclosure surface in the range of about 190 to about 300 degrees F.

34. A method according to claim 16, further comprising the operations of:

enclosing the heated gas in the defined volume that is defined at least partially by an enclosure surface; and maintaining the temperature of the enclosure surface in the range of about 220 to about 250 degrees F.

35. A method according to claim 16, further comprising the operations of:

enclosing the heated gas in the defined volume defined at least partially by an enclosure surface;

maintaining the temperature of the enclosure surface in a first range of temperatures; and maintaining a temperature of the fluid in the fluid bath at a temperature less than the lowest temperature of the first range.

36. A method according to claim 16, the method further comprising the operations of:

selecting the selected rate to be not more than a maximum rate at which the meniscus and the thin film will form on the opposite sides of the disk as the disk moves from the fluid bath;

enclosing the heated gas in the defined volume that is defined at least partially by an enclosure surface;

maintaining the temperature of the enclosure surface in the range of about 160 to about 400 degrees F.;

the flowing operation also flowing the gas into contact with the enclosure surface to maintain the temperature of the heated gas in the range of about 160 to about 210 degrees F.; and controlling the relative humidity in the defined volume as the disk is moved along the selected path and out of the fluid bath.

37. A method according to claim 36, wherein:

the controlling operation controls the rate of flow of the heated gas as the disk is moved along the selected path to maintain the relative humidity in the defined volume less than about forty percent.

38. A method according to claim 16, the method further comprising the operations of:

controlling a pressure at which the flowing heated gas flows into the defined volume; and controlling a rate at which the exhausting operation is performed to exhaust the heated gas containing the evaporated thin film vapor;

the controlling operations maintaining the flowing heated gas continuous.

* * * * *

UNITED STATES PATENT AND TRADEMARK OFFICE
CERTIFICATE OF CORRECTION

PATENT NO. : 6,446,355 B1
DATED : September 10, 2002
INVENTOR(S) : Jones et al.

It is certified that error appears in the above-identified patent and that said Letters Patent is hereby corrected as shown below:

Title page,
Item [73], please amend to read as follows:
-- Lam Research Corporation, Fremont, CA (US) and
Oliver Design, Inc., Scotts Valley, CA (US) --.

Signed and Sealed this

Fifteenth Day of November, 2005

JON W. DUDAS
*Director of the United States Patent and Trademark Office*